US012785054B2

(12) United States Patent
Booy et al.

(10) Patent No.: US 12,785,054 B2
(45) Date of Patent: Nov. 3, 2026

(54) ION MIRROR FOR TIME-OF-FLIGHT MASS SPECTROMETER

(71) Applicant: DH Technologies Development Pte. Ltd., Singapore (SG)

(72) Inventors: Aaron Timothy Booy, Barrie (CA); Robert Haufler, Toronto (CA)

(73) Assignee: DH TECHNOLOGIES DEVELOPMENT PTE. LTD., Singapore (SG)

( * ) Notice: Subject to any disclaimer, the term of this patent is extended or adjusted under 35 U.S.C. 154(b) by 384 days.

(21) Appl. No.: 18/560,556

(22) PCT Filed: May 12, 2022

(86) PCT No.: PCT/IB2022/054428

§ 371 (c)(1),
(2) Date: Nov. 13, 2023

(87) PCT Pub. No.: WO2022/238953

PCT Pub. Date: Nov. 17, 2022

(65) Prior Publication Data

US 2024/0274428 A1 Aug. 15, 2024

Related U.S. Application Data

(60) Provisional application No. 63/188,908, filed on May 14, 2021.

(51) Int. Cl.
*H01J 49/06* (2006.01)
*H01J 49/40* (2006.01)

(52) U.S. Cl.
CPC ............ *H01J 49/068* (2013.01); *H01J 49/40* (2013.01); *H01J 49/405* (2013.01); *H05K 2201/041* (2013.01)

(58) Field of Classification Search
CPC ...... H01J 49/405; H01J 49/065; H01J 49/068; H01J 49/40; H01J 49/401; H01J 49/4235; H05K 2201/041; H05K 1/144
See application file for complete search history.

(56) References Cited

U.S. PATENT DOCUMENTS 5,994,695 A * 11/1999 Young .................. H01J 49/067 250/287
6,570,152 B1 * 5/2003 Hoyes .................. H01J 49/406 250/287

(Continued)

FOREIGN PATENT DOCUMENTS

CN 102568976 B 7/2014
EP 1137044 B1 5/2007

(Continued)

OTHER PUBLICATIONS

International Invitation to Pay Additional fees and Partial Search Report, PCT/IB2022/054428, dated Aug. 18, 2022, 14 pages.

(Continued)

*Primary Examiner* — Wyatt A Stoffa
*Assistant Examiner* — Mica J Einhorn
(74) *Attorney, Agent, or Firm* — Potomac Law Group, PLLC; Reza Mollaaghababa; Brian Hairston

(57) ABSTRACT

An ion mirror for use in a time-of-flight mass spectrometer includes a mirror ring sub-assembly for creating an electric potential field to decelerate incoming ions and accelerate outgoing ions, and a grid sub-assembly comprising one or more grid plates, which define bounds of the electrical potential field of the ion mirror. The mirror ring sub-assembly and the grid sub-assembly are coaxially superposed, and the mirror ring sub-assembly is mechanically engaged with the grid sub-assembly only at one of the grid plates.

19 Claims, 21 Drawing Sheets

(56) References Cited

U.S. PATENT DOCUMENTS

| | | | | |
|---|---|---|---|---|
| 12,027,359 | B2 * | 7/2024 | Carney | H01J 49/068 |
| 12,400,848 | B2 * | 8/2025 | Booy | H01J 49/063 |
| 12,518,957 | B2 * | 1/2026 | Kudo | H01J 49/068 |
| 2004/0036029 | A1 * | 2/2004 | Bertsch | H01J 49/40 250/396 R |
| 2012/0298853 | A1 * | 11/2012 | Kurulugama | H01J 49/0404 250/282 |
| 2015/0060655 | A1 * | 3/2015 | Garside | H01J 49/065 250/281 |
| 2015/0270115 | A1 | 9/2015 | Furuhashi | |
| 2015/0318156 | A1 * | 11/2015 | Loyd | H01J 49/068 250/287 |
| 2019/0272986 | A1 * | 9/2019 | Cornish | H01J 49/0459 |
| 2020/0373142 | A1 * | 11/2020 | Verenchikov | H05K 1/0225 |
| 2021/0005441 | A1 * | 1/2021 | Booy | H01J 49/044 |
| 2021/0202222 | A1 * | 7/2021 | Carney | H01J 49/04 |
| 2021/0242007 | A1 * | 8/2021 | Verenchikov | H01J 49/405 |

FOREIGN PATENT DOCUMENTS

| | | | | |
|---|---|---|---|---|
| WO | WO-0201599 | A2 * | 1/2002 | H01J 49/40 |
| WO | WO-2013140139 | A2 * | 9/2013 | H01J 49/068 |
| WO | WO-2013188555 | A1 * | 12/2013 | H01J 49/405 |
| WO | 2019030474 | A1 | 2/2019 | |
| WO | WO 2019167026 | A1 * | 9/2019 | H01J 49/24 |
| WO | 2019202338 | A1 | 10/2019 | |
| WO | WO 2019229457 | A1 * | 12/2019 | H01J 49/405 |

OTHER PUBLICATIONS

International Preliminary Report on Patentability for International Application No. PCT/IB2022/054428 mailed Aug. 8, 2023.

International Search Report and Written Opinion, PCT/IB2022/054428, dated Nov. 15, 2022, 26 pages.

Written Opinion of the International Preliminary Examining Authority for International Application No. PCT/IB2022/054428 dated May 15, 2023.

* cited by examiner

ION MIRROR FOR TIME-OF-FLIGHT MASS SPECTROMETER

Related Applications

This application is a 35 U.S.C. § 371 national stage filing of International Application No. PCT/IB2022/054428, filed on May 12, 2022, which claims priority to U.S. Provisional Application No. 63/188,908 filed on May 14, 2021, the contents of both of which are incorporated herein in their entirety.

BACKGROUND

The present disclosure is generally directed to an ion mirror for use in a time-of flight (TOF) mass spectrometer, and more particularly to an ion mirror with a plurality of mirror rings formed with a PCB material.

Mass spectrometry (MS) is an analytical technique for determining the structure of test chemical substances with both qualitative and quantitative applications. MS can be useful for identifying unknown compounds, determining the composition of atomic elements in a molecule, determining the structure of a compound by observing its fragmentation, and quantifying the amount of a particular chemical compound in a mixed sample. Mass spectrometers detect chemical entities as ions such that a conversion of the analytes to charged ions must occur during the sampling process.

In the time-of-flight mass spectrometry (TOF-MS) technique, ions are accelerated in an electric field to a common kinetic energy towards a detector located a distance away. Because the ions will have a variation in initial location and starting kinetic energy, it is desired to have a means of focusing. One way is to reverse the trajectories using an ion mirror. A typical way to construct such an ion mirror is to stack a plurality of ring structures, each ring being separated from an adjacent ring by insulator, so that each ring can be raised to a predetermined electric potential (voltage) in order to create a desired reflecting field. This field can be linear, parabolic or may follow some other formula in order to provide the necessary focusing result. An ion mirror constructed in such a way will have the ends of the field defined by either a plate or a grid. The grid is required to allow the ions to enter and exit the ion mirror. The field will not be smooth close to the inner edge of the ion mirror rings, rather will have pronounced steps. It is essential that ions not travel in this region. Moving away from the inner edge of the mirror rings, towards the center, the field becomes smoother. This is the zone where it is desired to keep the ion trajectories. The thinner the ion mirror rings can be constructed, the closer to the inner edge the field can become smooth.

The primary dimension of an ion mirror is the distance between the entrance grid and the back plate (herein also referred to as a mirror plate). This dimension must be well-controlled, and the plate and grid should be parallel. The balance of the rings' location is less important. If a mirror is constructed in a way that the middle rings are used to space and locate the ends, all parts must be constructed to a significantly tight tolerance. An alternative way to construct an ion mirror is to independently locate the ends from the middle spacer rings. Indeed, if the mirror dimensions perpendicular to the primary mirror axis were sufficiently large, the middle rings could be omitted. The middle rings are present to allow the ion mirror to be constructed in a small overall size by shielding mirror field from the external environment and by helping to smooth the field with the desired voltage to each ring. Thus, it is possible to construct an ion mirror where the ends are located precisely and the middle rings are located less precisely, without sacrificing the performance. Additionally, the material used to construct the middle mirror rings could be chosen for factors such as cost and ease of construction. Thermal variation also needs to be considered. In addition to being constructed of materials that can be machined to a tight tolerance, thermal expansion is important to account for. Freeing the primary dimension from being dependent on behavior of every other part simplifies the thermal expansion problem.

There have been attempts to build mirror rings using printed circuit board (PCB) materials, e.g., FR4/G-10. There are challenges, however. Looser tolerance is the primary challenge. Additionally, outgassing, poor machinability, mechanical alignment are also difficult with these materials. The advantages are that one can integrate electrical circuit more easily thereon so that they accomplish the voltage dividing as well. Usually, the dividing of the voltage is accomplished using a separate assembly.

It is desired to make the rings as thin as possible since it will allows the field to be smoother close to the inner edge. The thinner the rings are, the larger the volume of smooth field inside of the ion mirror becomes. Making the rings thin while also having the desired tolerances is challenging. This is especially true for two stage ion mirrors. It is often the case that is it desired to have an ion mirror that has two fields. Adjustment of the ratio of the fields provides the focusing effect needed to cause high mass resolving power. Two stage ion mirror will have a grid located between the entrance grid and the back plate of the ion mirror. When the rings are very thin, the frame that supports the middle mirror grid simply cannot be constructed, as it will not have the strength required to support the tension of the grid wires. The present teachings provide a means to maintain a sufficient thickness for the frame of the middle grid thick, while allowing thin rings.

SUMMARY

In one aspect, the present teachings provide an ion mirror that can be used in a TOF-MS. An ion mirror according to the present teachings can include a mirror ring sub-assembly that creates an electric field to decelerate incoming ions and accelerate outgoing ions, and a grid sub-assembly that defines bounds of the electrical field of the ion mirror. While the mirror ring sub-assembly and the grid sub-assembly are coaxially superposed, they are constructed as independent structures such that the tolerances of the two independent structures do not affect one another. As such, more relaxed tolerance of the mirror ring sub-assembly does not negatively affect the grid sub-assembly that requires relatively tighter tolerance to satisfactorily perform. Due to the independent construction, the ion mirror can be manufactured to satisfy operational requirements while keeping the manufacturing cost down.

In many embodiments, an ion mirror according to the present teachings includes a plurality of mirror rings that are stacked up along an axial direction and are aligned relative to one another. Further, in addition to the mirror rings, the ion mirror includes at least one mirror grid (mesh), to allow ions to enter and exit the ion mirror. An ion mirror according to the present teachings can provide a more homogeneous voltage gradient, improved tolerances of grid spacing, improved stability against temperature variations, and lower cost, among other advantages.

In one aspect, an ion mirror for use in a time-of-flight mass spectrometer is disclosed, which includes a mirror ring that is fabricated of an electrically non-conducting material such as a PCB material, has been plated with a conductive material, and has a window that is configured to allow passage of ions therethrough. A first electrode is disposed around at least a portion of a circumference of the window and is configured for application of a DC voltage thereto for generating a field within the window for affecting trajectory of ions passing through the window. A second electrode is disposed on a top surface of the frame and is in electrical contact with the first electrode. An electrical contact pad is disposed on a bottom surface of the frame and is in electrical contact with the first electrode and at least one electrical resistive element that is disposed between the first and the second electrode to provide voltage division.

An ion mirror according to the present teachings for creating an electric field to decelerate incoming ions and accelerate outgoing ions can include a grid sub-assembly and a mirror-ring sub-assembly. The grid sub-assembly includes a first plate unit that supports an entrance/exit grid for defining a boundary of a first electric field; a second plate unit for defining a boundary of a second electric field; and a third plate unit that supports a middle grid for defining a boundary between the first electric field and the second electric field. The mirror ring sub-assembly includes a first stack of mirror rings disposed between the first plate unit and the third plate unit, the first stack of mirror rings creating the first electric field; and a second stack of mirror rings disposed between the second plate unit and the third plate unit, the second stack of mirror rings creating the second electric field. The mirror ring sub-assembly and the grid sub-assembly are coaxially positioned relative to one another, and the mirror ring sub-assembly and the grid sub-assembly float relative to one another by being mechanically engaged only at one of the first plate unit, the second plate unit, or the third plate unit.

In some embodiments, the mirror ring sub-assembly can be anchored to the first plate unit of the grid sub-assembly. The second plate unit can be configured as a solid plate or configured to support an end grid.

In some embodiments, the grid sub-assembly can further include one or more posts disposed between the first plate unit and the third plate unit, and between the second plate unit and the second plate unit, such that positions between the first plate unit, the second plate unit, and the third plate unit are maintained by the one or more posts. The one or more posts can comprise a non-conducting material. For example, the one or more posts can comprise any of borosilicate glass, quartz, ceramic, and polymer.

In some embodiments, the first and second stacks of mirror rings can comprise a metallic conducting material or a PCB material with a conductive metal layer deposited at least on a portion thereof for applying the sequentially divided voltages.

An ion mirror according to the present teachings for use in a time-of-flight mass spectrometer can include at least one mirror ring, which comprises a frame that is electrically non-conducing, having a window configured to allow passage of ions therethrough; a first electrode disposed around at least a portion of a circumference of the window and being configured for application of a DC voltage thereto for generating a field within the window for affecting trajectory of ions passing through the window; a second electrode disposed on a top surface of the substrate and in electrical contact with the first electrode; an electrical contact pad disposed on a bottom surface of the substrate and in electrical contact with the first electrode; and at least one electrical resistive element disposed between the first and second electrode.

In some embodiments, the frame can include a printed circuit board (PCB). The PCB can be made of Rogers material. The at least one electrical resistive element can be integrated in the PCB.

In some embodiments, the at least one mirror ring can includes a plurality of mirror rings disposed in series relative to one another such that their respective windows are substantially aligned to allow passage of ions therethrough. For each pair of adjacent mirror rings, the second electrode of a lower mirror ring of the pair can be configured to make electrical contact with the electrical contact pad of an adjacent upper mirror ring such that a portion of a DC voltage applied to the first electrode of the lower mirror ring is applied to the electric contact pad of the upper mirror ring. As such, the electrical resistive element can form a voltage divider between the first electrodes of the pair of adjacent mirror rings. For providing a compression contact with the electrical contact pad of the upper mirror ring, the second electrode of the lower mirror ring can include at least one spring.

Further, each of the mirror rings can include a plurality of holes for aligning the plurality of mirror rings. The ion mirror can further include a plurality of spacers disposed corresponding to each of the plurality of holes. The spacers can be substantially formed as washers exhibiting electrically insulating property. In some implementations, the washers can include ceramic or PEEK. The substrate can have a thickness in a range of about 0.5 mm to about 4 mm, and the spacers can have a thickness in a range of about 0.5 mm to about 2 mm. Also, each of the spacers can include an inner hole at a center thereof. A first set of rods can be further included, which are configured to align and mechanically join the plurality of mirror rings while passing through the inner hole in the spacers disposed at the plurality of mirror rings.

In some embodiments, any of the first electrode, the second electrode, and the conducting member can include at least one metal layer. The at least one metal layer can include a copper layer deposited on a surface of the substrate and a gold layer deposited on a surface of the copper layer. In some implementations, the at least one metal layer can have a thickness in a range of about 35 μm to about 70 μm.

In some embodiments, the ion mirror can further include an entrance grid plate disposed at an upstream end of the ion mirror; a middle grid plate disposed between the plurality of mirror rings; and a mirror plate disposed at an downstream end of the ion mirror. Further, at least one post can be disposed between the entrance grid plate and the middle grid plate, and between the middle grid plate and the mirror plate. The at least one post maintains relative distances between the entrance grid plate, the middle grid plate, and the mirror plate, and the at least one post can include a non-conducting material.

In some embodiments, each of the plurality of mirror rings can include at least one opening such that the opening of the mirror rings is in substantial register when the mirror rings are disposed in series relative to one another, and the opening allows the at least one post to be inserted through the mirror ring sub-assembly without engaging with the mirror ring sub-assembly. In some implementations, the at least one post can include any of ceramic, quartz, borosilicate glass, and polymer.

In some embodiments, a second set of rods can be further included. The at least one post can include a hollow that extends along a longitudinal direction thereof, and the second set of rods can be inserted through the hollow in the at least one post, thereby fastening the upper post, the middle grid plate, and the lower post.

In some embodiments, the middle grid plate can include two plates, each having a window; and a grid interposed between the two plates in the window. The ion mirror can further include one or more middle grid washers that include an inner hole at a center thereof. The middle grid plate can include at least one hole such that the middle grid washers can be accommodated in the at least one hole formed in the middle grid plate, and the first set of rods are inserted through the inner hole of the middle grid washers.

In some embodiments, the ion mirror can further include a first intermediate mirror ring disposed downstream of the middle grid plate; and a second intermediate mirror ring disposed upstream of the middle grid plate. Each of the first intermediate mirror ring and the second intermediate mirror ring includes a step that protrudes toward the middle grid plate, and each of the two plates of the middle grid plate includes a corresponding step so as to render an inner portion thereof thinner than the rest of the middle grid plate. Further, the middle grid washers can be pressed against spacers disposed in a hole of the mirror ring.

A time-of-flight mass analyzer according to the present teachings can include an inlet for receiving a plurality of ions, a pusher electrode for directing at least a portion of the ion into a field-free drift path, an ion reflector for receiving at least a portion of the ions propagating through the field-free drift path and reflecting the ions onto a second field-free drift path, and a detector disposed at a distal end of the second field-free drift path for receiving at least a portion of the reflected ions and generating one or more detection signals in response to detection of the ions. The ion reflector can include at least one ion mirror according to the present teachings.

In some embodiments, the mass analyzer can further include a mass filter disposed upstream of the time-of-flight mass analyzer for selecting at least a portion of the plurality of ions; and one or more transfer ion optics disposed upstream of the mass filter for transmission of the plurality of ions from an ion source to the mass filter.

An ion mirror according to the present teachings for use in a time-of-flight mass spectrometer can include a grid plate configured to receive an ion grid at an inner portion thereof; and at least one intermediate mirror ring disposed adjacent to the grid plate, the intermediate mirror ring comprising a window at a central portion thereof to allow transmission of ions. The intermediate mirror ring can include an inner portion that abuts the window and an outer periphery portion that surrounds the inner portion, and the inner portion and the outer periphery portion can be separated by a step that protrudes toward the grid plate such that a thickness of the inner portion is greater than a thickness of the outer periphery portion. Further, the grid plate can include a corresponding step that separates a grid holding region and an outer periphery portion that surrounds the grid holding region such that a thickness of the outer periphery portion is greater than a thickness of the grid holding region. The thickness of the grid holding region of the grid plate and the thickness of the inner portion of the intermediate mirror ring can be substantially equal. At least one mirror ring can be disposed adjacent to the intermediate mirror ring. The thickness of the mirror ring can be substantially uniform, and the thickness of the mirror ring, the thickness of the inner portion of the intermediate mirror ring, and the thickness of the grid holding region of the grid plate are substantially equal.

DETAILED DESCRIPTION

In a time-of-flight mass spectrometer (TOF-MS), the mass-to-charge ratio (m/z) of an ion is determined via measurement of the ion travel time within a time-of-flight chamber from its entrance until its detector. Ions with different m/z ratios exhibit different flight times with ions having higher m/z ratios reaching lower speeds. Thus, by measuring the time it takes for an ion to reach a detector at a known distance, the m/z ratio of the ion can be measured.

In practice, however, all ions having the same m/z ratio may not reach the same velocity, and especially at higher masses, they may gain different kinetic energies while passing through the electric field (e.g., due to inhomogeneities in the field). To make the flight times more uniform for the ions having the same m/z ratio, despite differences in their kinetic energies, an ion mirror can be added to a TOF-MS.

Figure 1:
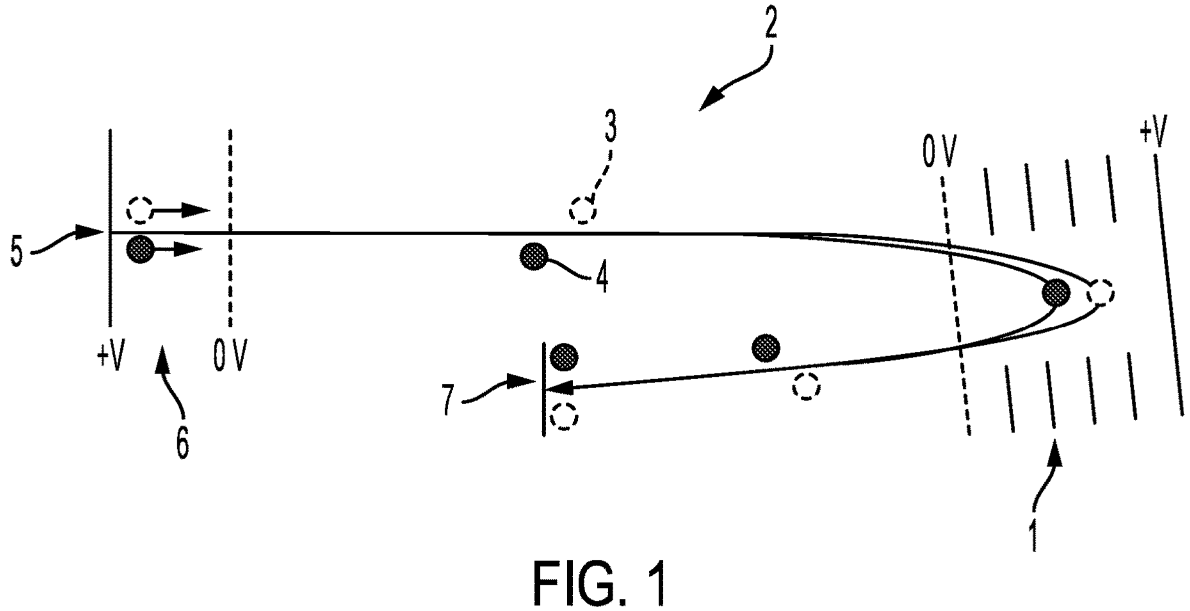
FIG. 1 conceptually shows a flight path of a time-of-flight mass analyzer.

As shown in FIG. 1, a TOF analyzer 2 may include an ion mirror 1 at an end thereof, which includes a series of ring electrodes to which high voltages can be applied. When an ion travels into the ion mirror 1, it is reflected in the opposite direction due to an electric field established by the high voltages. Since a faster ion 3 travels farther into the ion mirror 1 than a slower ion 4 before it is reflected back, its faster velocity can be compensated by the longer flight path, and the range of flight times for the ions having the same m/z ratio can be narrowed. Accordingly, such a TOF-MS can distinguish ions having different m/z ratios with an improved resolution.

The present teachings are generally directed to an ion mirror for use in a TOF-MS, where the ion mirror includes a plurality of mirror rings and one or more ion grids (meshes). In some embodiments, such an ion mirror can include two sub-assemblies, where one sub-assembly is configured to hold and maintain the mirror rings in alignment relative to one another, and the other sub-assembly is configured to hold and align the one or more grids in place.

In general, the ion mirrors require that their grids be fabricated with a high precision with respect to their dimensional and positional tolerances. On the other hand, if the mirror rings are made of PCB materials (e.g. for reducing the cost), it is more challenging to achieve the required precision levels, which can in turn adversely affect the performance of the overall ion mirror. Therefore, in order to be able to use PCB materials for the fabrication of ion mirror rings in an ion mirror, there is a need to provide structures and fabrication methods that would allow more relaxed tolerances not to adversely affect the performance of the ion mirror.

To this end, an ion mirror according to the present teachings can include a grid sub-assembly and a mirror ring sub-assembly that are constructed as independent structures and combined. For example, the mirror ring sub-assembly and the grid sub-assembly can be coupled to the same base plate, but have no mechanical coupling between them at other places. In this manner, the tolerances associated with one sub-assembly cannot affect those associated with the other sub-assembly.

As such, the grid sub-assembly can be manufactured with precision machining using, for example, metals, quartz, ceramic, or borosilicate glass, and the mirror ring sub-assembly can be manufactured, for example, primarily using a PCB material, polyether ether ketone (PEEK), and ceramic. By constructing the two sub-assemblies as independent structures, more relaxed tolerances of the mirror ring sub-assembly can be tolerated and to the extent that the dimensions and/or or positions of the mirror rings may deviate from the desired values, the independence of the two structures can advantageously prevent an accumulation of such errors from adversely affecting the performance of the ion mirror.

Moreover, in embodiments in which borosilicate posts are employed in the grid sub-assembly, due to the low thermal expansion of the borosilicate glass posts, the relative positions between the grids can be maintained with less variation with respect to temperature changes. Accordingly, the ion mirror can be manufactured more economically while achieving improved overall performances.

Figure 2:
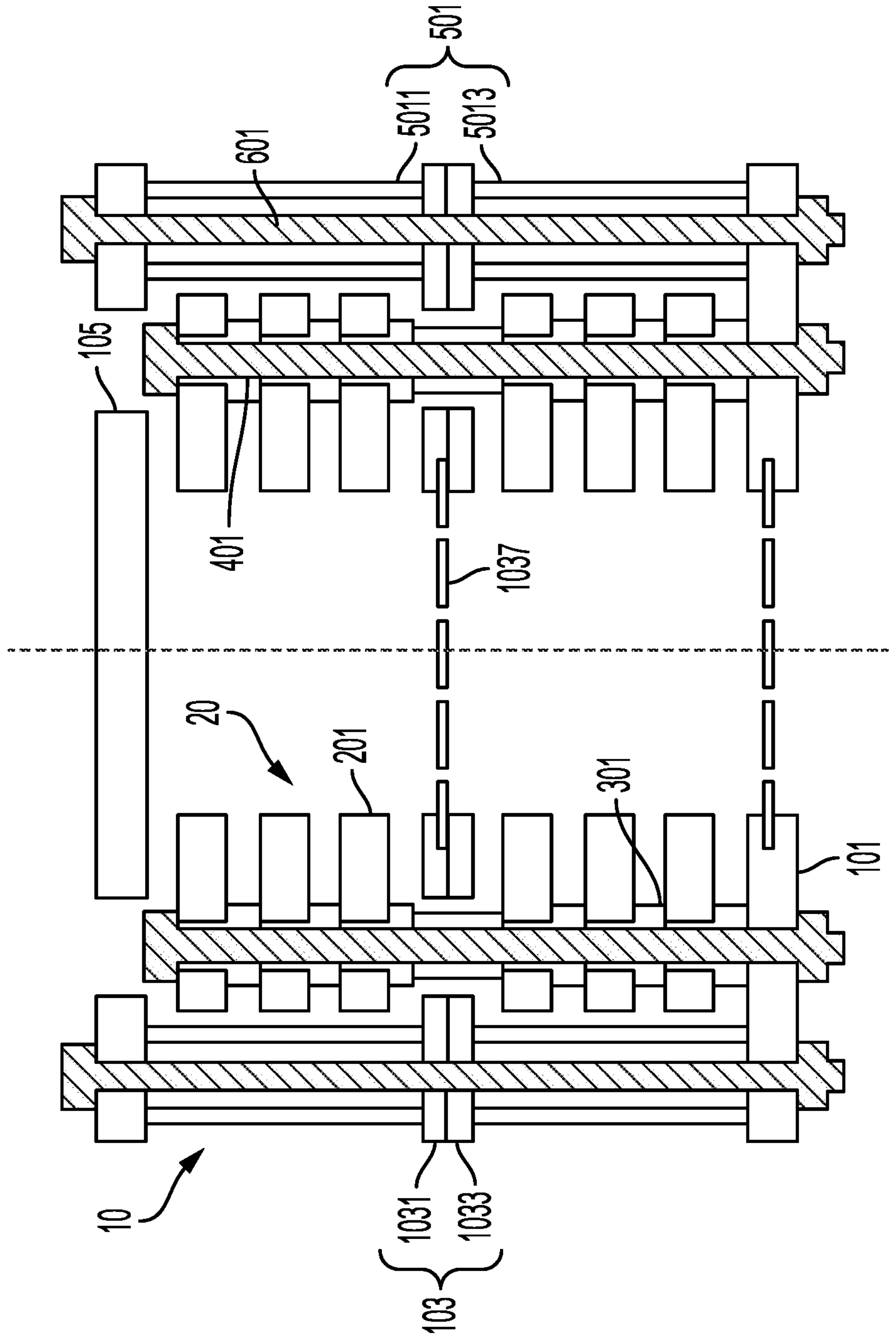
FIG. 2 is a schematic of an ion mirror for TOF-MS according to the present teachings.

FIG. 2 shows a schematic view of an ion mirror for TOF-MS according to the present teachings. In many embodiments, ion mirror 1 includes a grid sub-assembly 10 and a mirror ring sub-assembly 20. The grid sub-assembly 10 includes an entrance grid plate 101, a middle grid plate 103, and a mirror plate 105. The mirror ring sub-assembly includes a plurality of mirror rings 201. As shown in FIG. 2, while the grid sub-assembly 10 and the mirror ring sub-assembly 20 share the entrance grid plate 101 as their respective base, the two sub-assemblies are mechanically engaged with each other at no other places. As such, the grid sub-assembly 10 and the mirror ring sub-assembly 20 can be independently manufactured with different tolerances. Although FIG. 2 depicts an example where there is no mechanical coupling between the two sub-assemblies except at the entrance grid plate 101, even if the two sub-assemblies were to contact each other at other places, as long as such contact is made in a loosely-fitted manner (i.e., so long as the two sub-assemblies are not so mechanically inter-connected that a substantial force can be transmitted via the contact, and therefore they cannot be manufactured independently with different tolerances), the contact may not be considered as a “mechanical coupling.” Herein, the grid sub-assembly 10 and the mirror ring sub-assembly 20 “mechanically float” relatively to one another because other than being coupled to the same base plate, the two sub-assemblies make no other “mechanical coupling” with one another.

Further, the example shown in FIG. 2 depicts that the anchoring is at the entrance grid plate 101. However, the present teachings are not limited to such a configuration. In some embodiments, the grid sub-assembly 10 and the mirror ring sub-assembly 20 can be anchored at the mirror plate 105 without being coupled at any other places. In some other embodiments, the grid sub-assembly 10 and the mirror ring sub-assembly 20 can be anchored at the middle grid plate 103 without being coupled at any other places.

Hereinbelow, various embodiments of an ion mirror according to the present teachings are described below.

Figure 3:
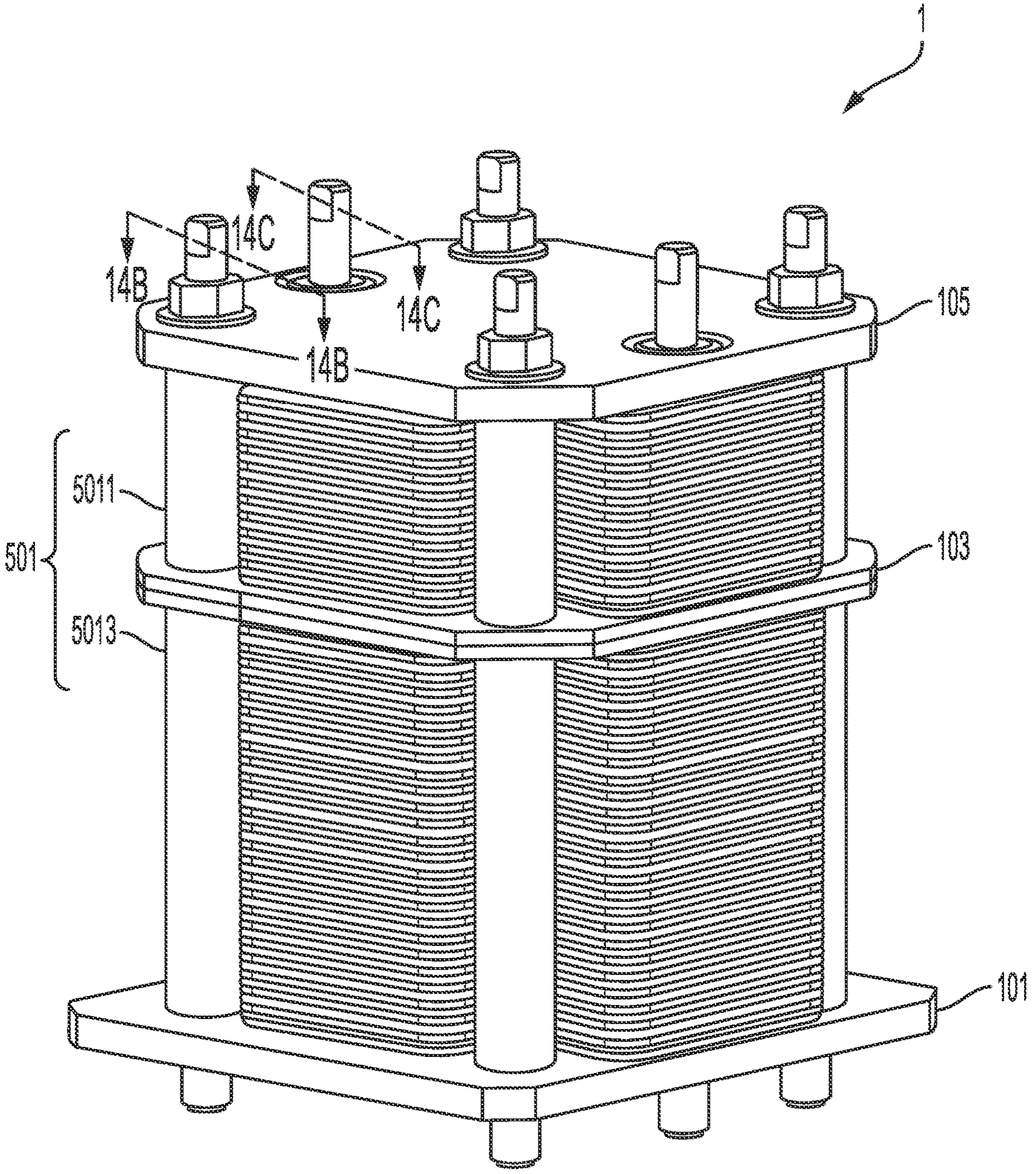
FIG. 3 shows an ion mirror for TOF-MS according to the present teachings.
Figure 4:
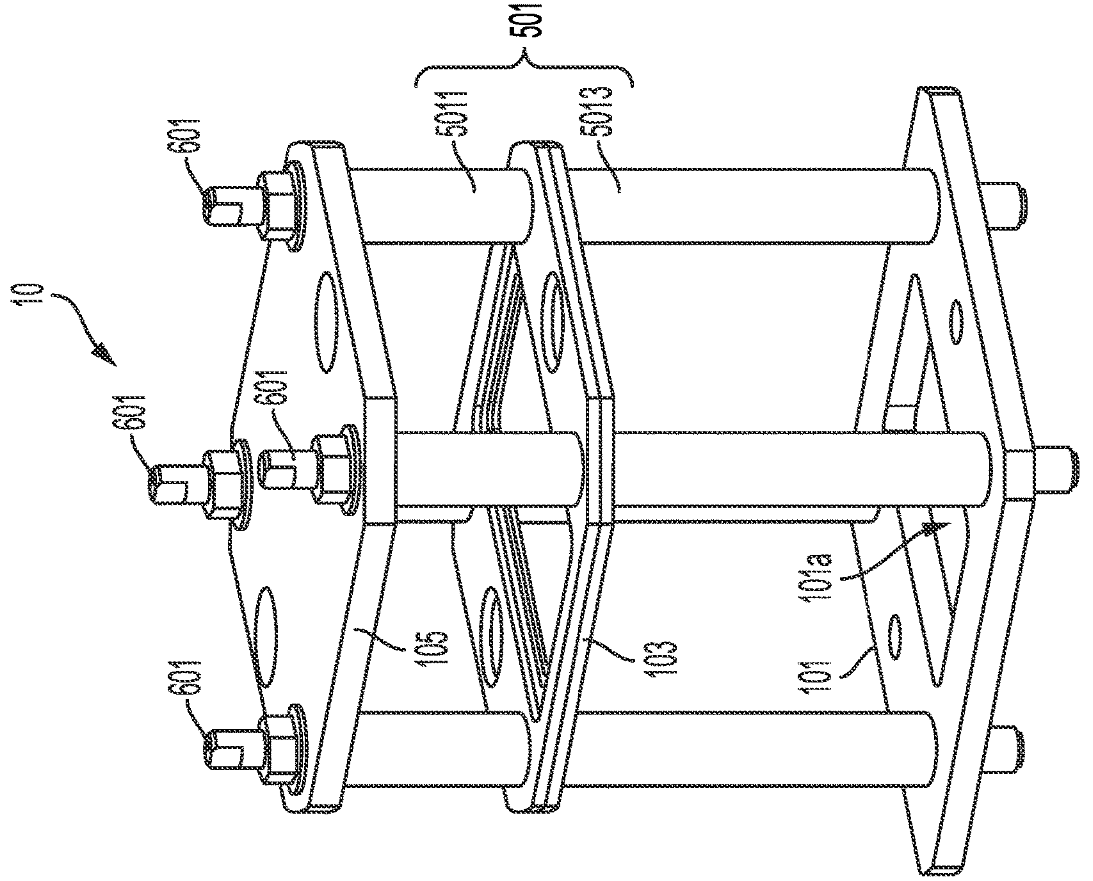
FIG. 4 shows a sub-assembly to hold grids in the ion mirror of FIG. 3 according to the present teachings.
Figure 5:
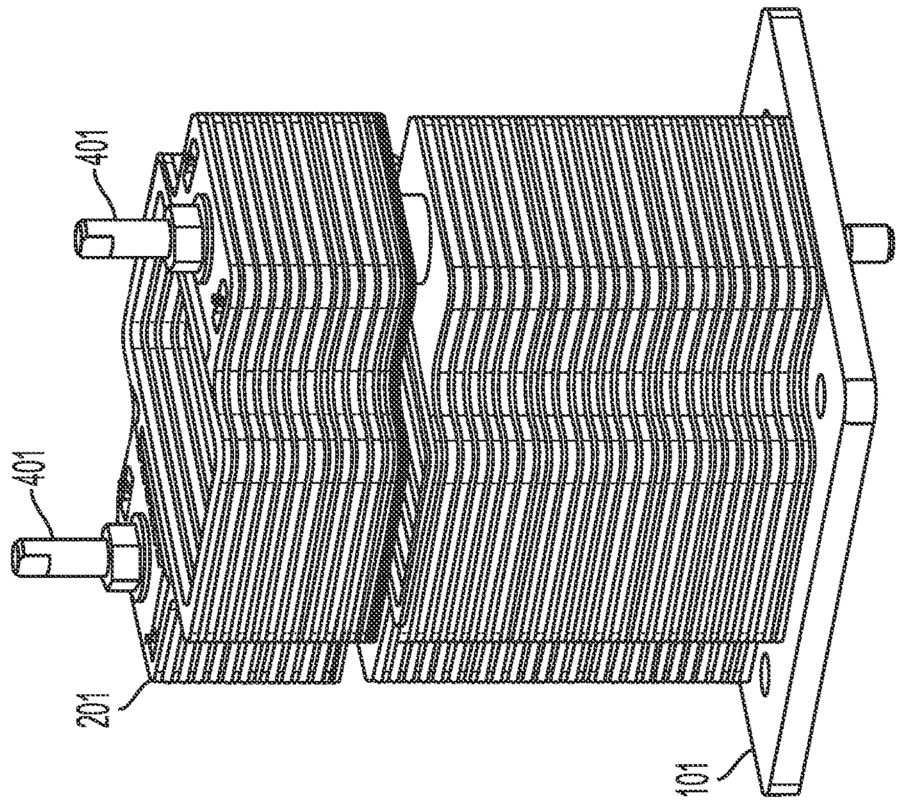
FIG. 5 shows a sub-assembly to hold mirror rings in the ion mirror of FIG. 3 according to the present teachings.

With reference to FIGS. 3-5, an ion mirror 1 for use in a TOF-MS according to the present teachings includes two independent sub-assemblies, namely, a grid sub-assembly 10 and a mirror ring sub-assembly 20. As discussed above, the grid sub-assembly 10 and the mirror ring sub-assembly 20 are mechanically decoupled from one another (e.g., they “float” relative to one another).

The grid sub-assembly 10 includes an entrance grid plate 101 having a window 101*a* that is configured to receive an entrance grid (not shown in this figure; see, e.g., a grid 1037 depicted in FIG. 13), a middle grid plate 103, and a mirror plate 105. As discussed in more detail below, in some embodiments, different voltages can be applied to the entrance grid plate 101, the middle grid plate 103, and the mirror plate 105, and hence to the grids disposed in those plates, so as to generate a desired electric field for application to the ions as they propagate through the ion mirror 1. By way of example, a DC voltage of −6,000 V can be applied to the entrance grid plate 101, a voltage of 0 V (at ground) can be applied to the middle grid plate 103, and a voltage of +2,000 V can be applied to the mirror plate 105.

The use of the grids (herein also referred to as a mesh) within the grid sub-assembly 10 can enhance the radial uniformity of the electric field within the ion mirror 1 by decreasing the radial voltage gradient and by confining the electric field between the grid planes. In other words, the grids precisely define the boundaries of an electric field while the mirror rings create an accelerating or decelerating potential via the voltage divider network built into them.

In this embodiment, the mirror ring sub-assembly 20 includes a plurality of mirror rings 201 that are arranged parallel to one another along an axial direction. The plurality of mirror rings 201 are electrically connected so as to provide a voltage divider such that the application of a voltage to the most proximal mirror ring (i.e., the first mirror ring that an incoming ion beam encounters) will result in the application of a different fraction of that voltage to each of the downstream mirror rings 201. Accordingly, such a voltage gradient can generate an axially-varying electric potential field within the ion mirror 1, which can decelerate the incoming ions such that the ions can come to rest and then reverse their propagation direction.

For example, when the entrance grid plate 101 is maintained at −6,000 V and the middle grid plate 103 is maintained at 0 V, the voltages applied to the plurality of mirror rings 201 between the entrance grid plate 101 and the middle grid plate 103 can vary sequentially between −6,000 V and 0 V in a stepwise manner. Similarly, when the mirror plate 105 is maintained at +2,000 V, the voltages applied to the plurality of mirror rings 201 can vary between the middle grid plate 103 and the mirror plate 105 sequentially between 0 V and +2,000 V in a stepwise manner. Accordingly, when positively charged ions enter the ion mirror 1 through the entrance grid of the entrance grid plate 101, the ions are decelerated as they pass through the plurality of mirror rings 201 toward the mirror plate 105 such that the ions come to rest prior to reaching the mirror plate 105, and subsequently, reverse their propagation direction and are accelerated through the plurality of mirror rings 201 toward the entrance grid plate 101, thereby being "reflected" by the ion mirror 1.

In order for the ions to be effectively reflected, the plurality of the mirror rings 201 are required to be arranged in parallel relative to one another and preferably orthogonal to the propagation direction of the ions. In many embodiments, voltage sources that are capable of generating precise voltage levels for application to the mirror rings are employed so as to ensure that the deviation of a nominal voltage applied to a mirror ring relative to the actual voltage applied thereto is less than a desired tolerance (e.g., less than about 0.1 V). Hereinbelow, the configuration of each of the plurality of mirror rings 201 of the ion mirror 1 according to the present teachings will be described with reference to FIGS. 6-8.

Figure 6:
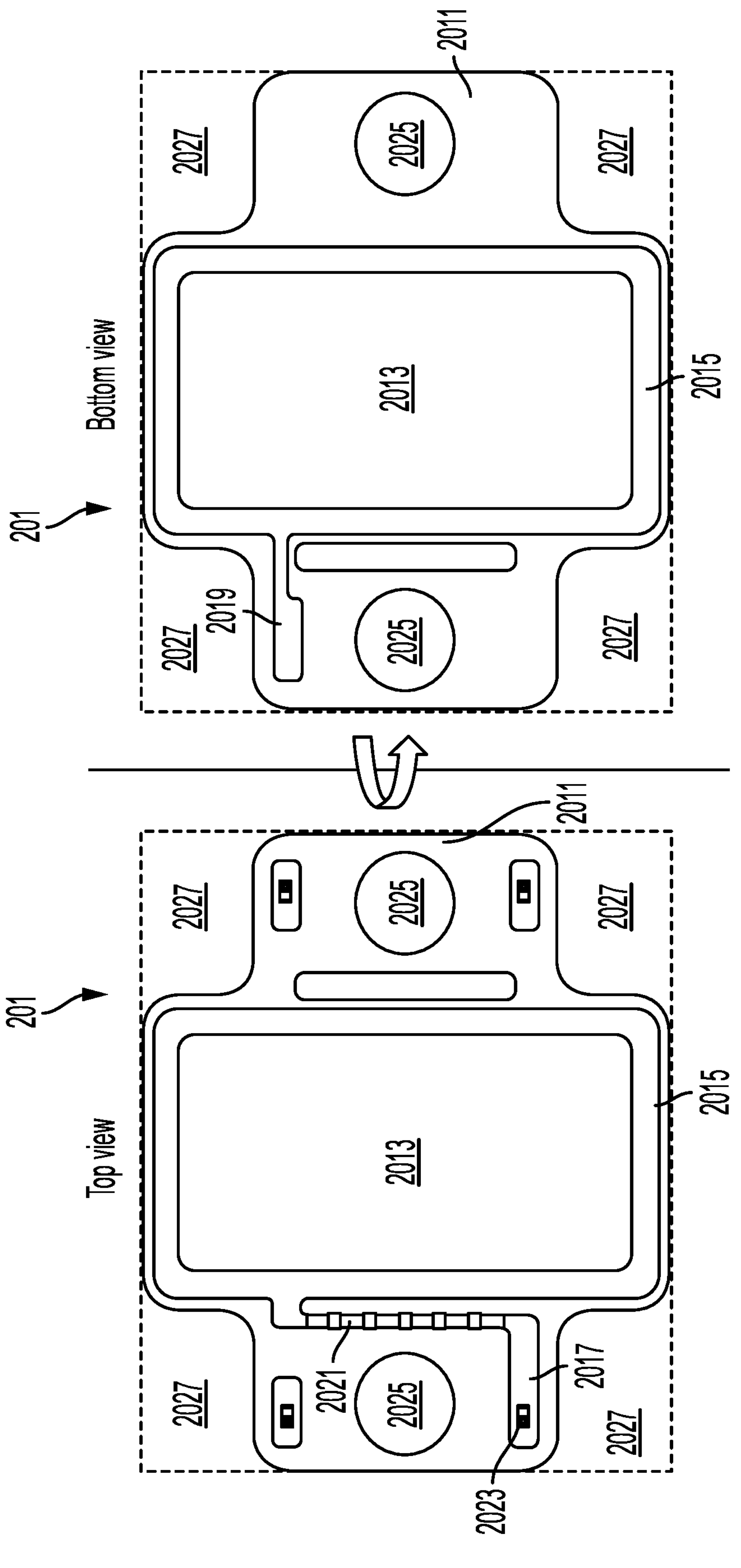
FIG. 6 shows a top view (left) and a bottom view (right) of a mirror ring in the ion mirror of FIG. 3 according to the present teachings.
Figure 7:
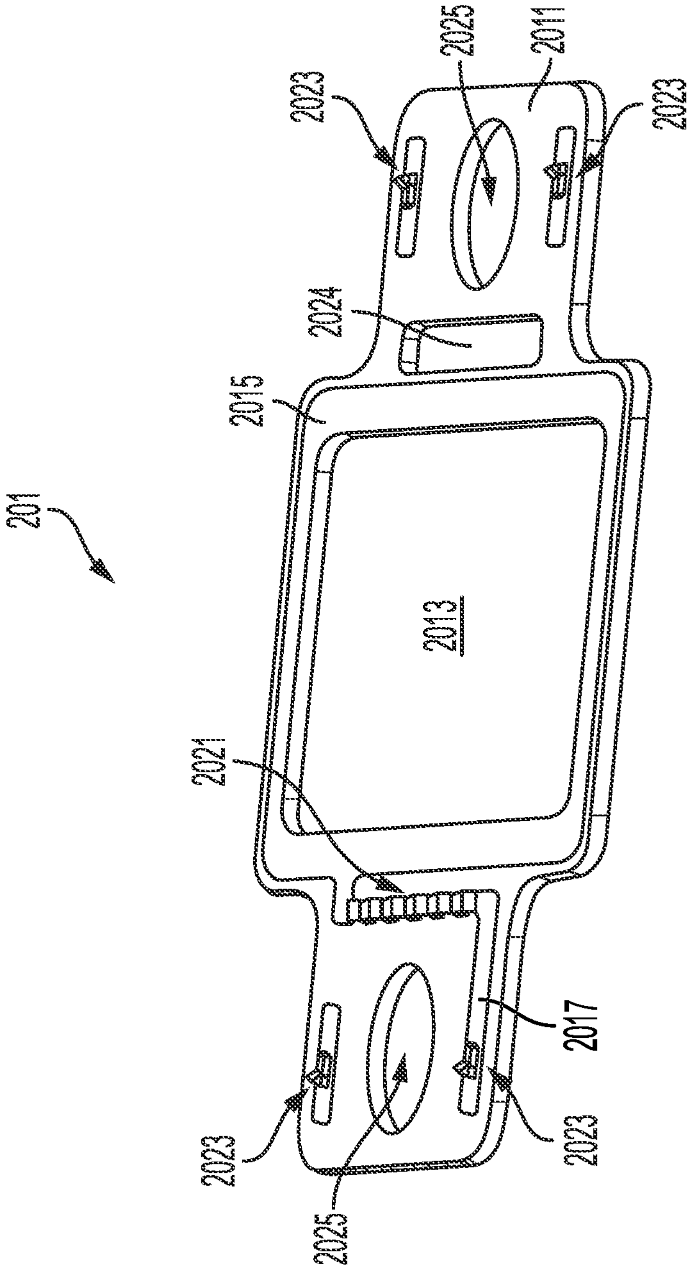
FIG. 7 shows a top perspective view of the mirror ring in the ion mirror of FIG. 3 according to the present teachings.
Figure 8:
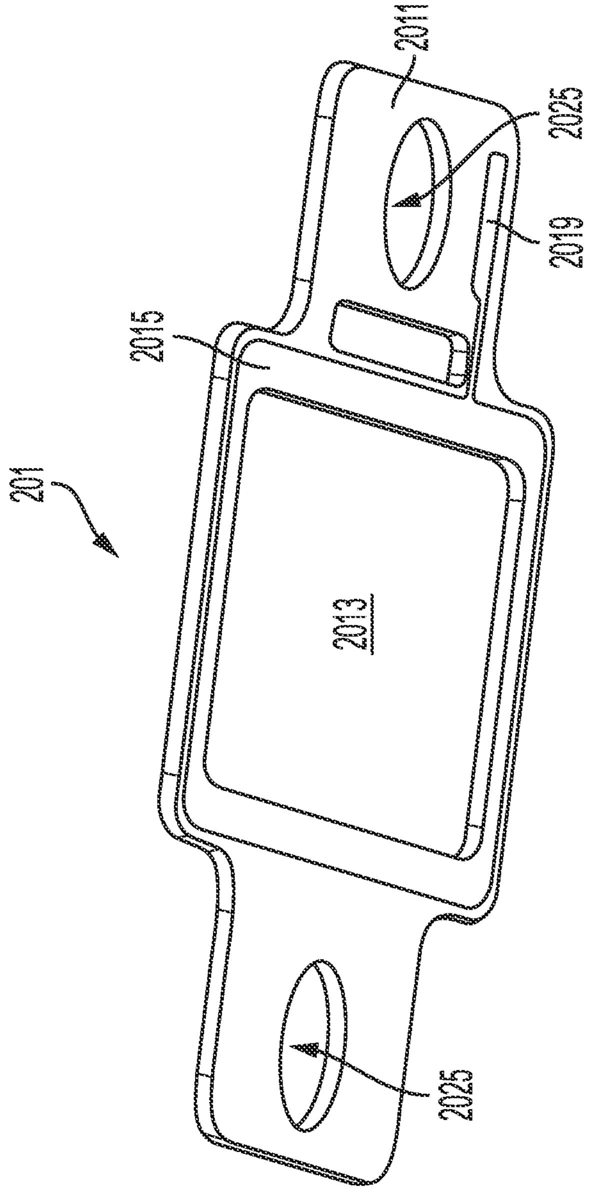
FIG. 8 shows a bottom perspective view of the mirror ring in the ion mirror of FIG. 3 according to the present teachings.

FIG. 6 shows a top view (left) and a bottom view (right) of a mirror ring 201 in the ion mirror 1 according to an embodiment of the present teachings; FIG. 7 shows a top perspective view of the mirror ring 201; and FIG. 8 shows a bottom perspective view of the mirror ring 201.

Each mirror ring 201 includes a frame 2011 (herein also referred to as a substrate) having a window 2013 at its central portion, which allows passage of ions therethrough. The mirror ring 201 further includes a first electrode 2015 disposed around the window 2013, a second electrode 2017 disposed on a top surface of the frame 2011 and in electrical connection with the first electrode 2015, and an electrical contact pad 2019 disposed on a bottom surface of the substrate 2011 and in electrical connection with the first electrode 2015. The mirror ring 201 also includes at least one electrical resistive element 2021 positioned between the first electrode 2015 and a terminal portion of the second electrode 2017. In this embodiment, the first electrode 2015 is in the form of a metal layer that covers an inner side surface of the window 2013 and extends outwardly therefrom, thereby covering a predetermined width around the window 2013 both on the top and bottom surfaces of the substrate 2011.

The terms "top" and "bottom," as used herein, refer to relative positions or directions based on the orientation shown in the drawings. The absolute positions or directions can differ depending on the installation orientation of the ion mirror.

In this embodiment, the frame 2011 is formed of an electrically non-conducing material. In particular, in this embodiment, the frame 2011 is formed using a printed circuit board (PCB). In some embodiments, the PCB is made of a Rogers material. An application of a DC voltage to the first electrode 2015 can generate an electric field within the window 2013 for affecting the trajectories of the ions passing through the window 2013.

On a top surface of the frame 2011, the second electrode 2017 is disposed so as to be in electrical contact with the first electrode 2015. On a bottom surface of the frame 2011, the electrical contact pad 2019 is disposed to be in electrical contact with the first electrode 2015. Each mirror ring 201 also includes a voltage divider such that the voltage applied to one mirror ring is conducted to the next mirror ring with a predetermined voltage drop. In some embodiments, the voltage divider is implemented as at least one electrical resistive element 2021. In some embodiments, as shown in FIG. 7, the electrical resistive element 2021 can be arranged between the first electrode 2015 and a terminal portion of the second electrode 2017 on the top surface of the mirror ring 201. However, the present teachings are not limited to such configuration, and in other embodiments, the electrical resistive element 2021 can be disposed on the bottom surface of the mirror ring 201 between the first electrode 2015 and a terminal portion of the electrical contact pad 2019. Either way, the first electrodes 2015 of the plurality of mirror rings 201 can be connected in series with the electrical resistive element 2021 disposed between any two mirror rings 201, and thereby each of the plurality of mirror rings 201 can be maintained at a different voltage such that the stacked-up mirror rings 201 can form a predetermined voltage gradient from the entrance grid plate 101 toward the mirror plate 105.

Any of the first electrode 2015, the second electrode 2017, and the electrical contact pad 2019 can be formed as a metal layer, or a plurality of metal layers. By way of example, in some embodiments, the metal layer can be implemented as a copper layer deposited on a surface of the PCB substrate 2011. In some embodiments, a gold layer can be additionally deposited on a surface of the copper layer. In some embodiments, the copper layer has a thickness in a range of about 35 μm to 70 μm, with a thin layer of gold deposited using, for example, chemical vapor deposition (CVD).

Figure 9:
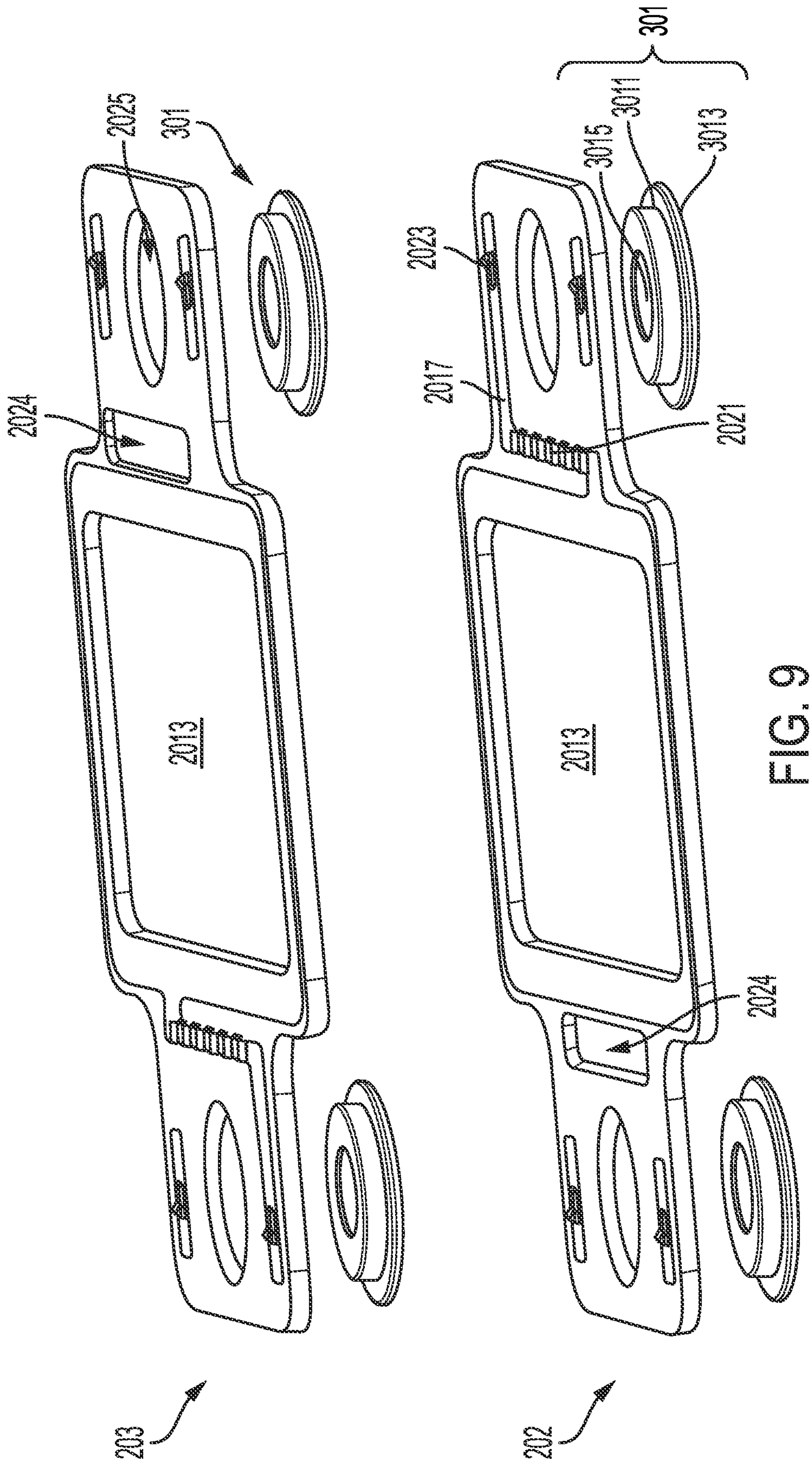
FIG. 9 shows two mirror rings arranged with washers interposed therebetween for the ion mirror of FIG. 3 according to the present teachings.
Figure 10:
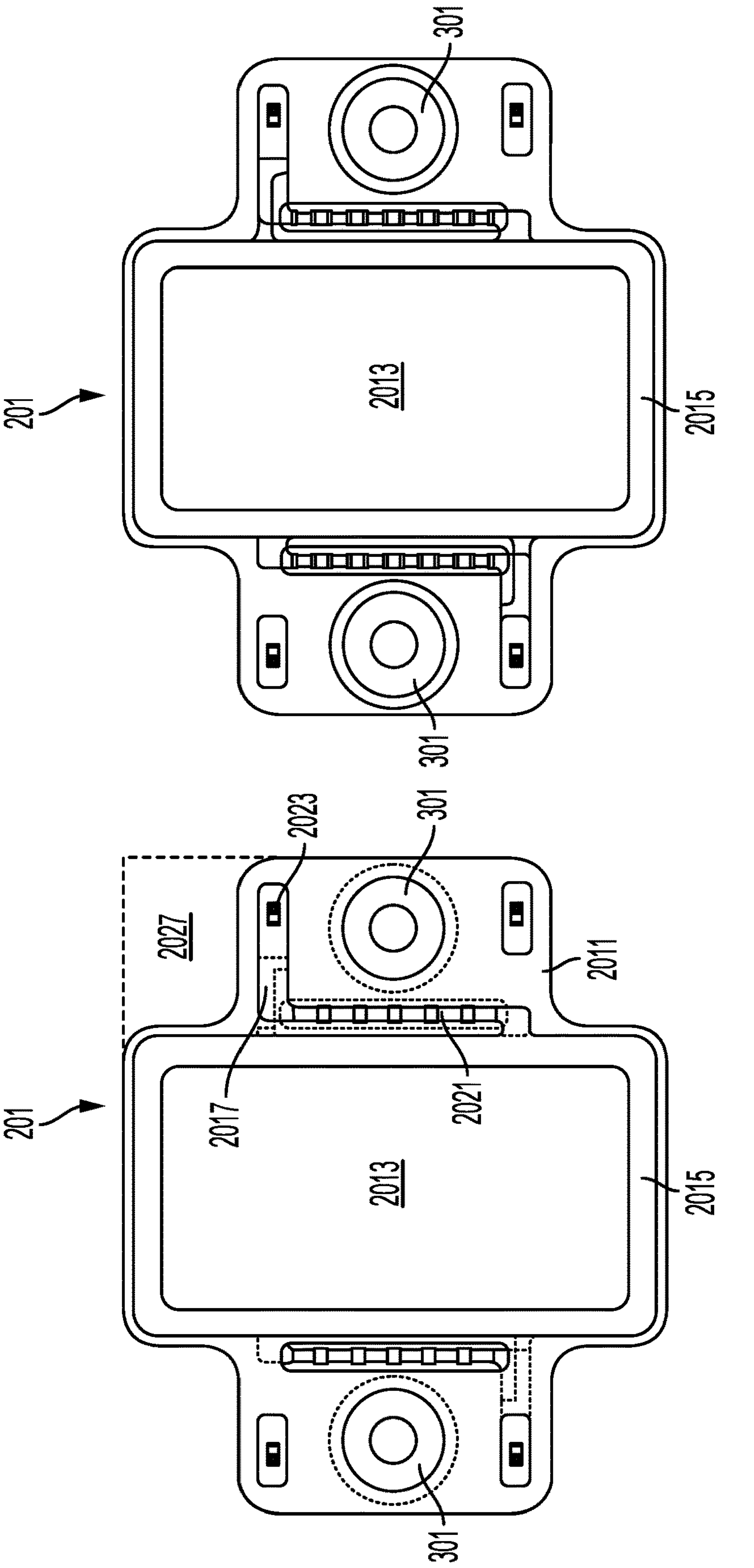
FIG. 10 shows a top view (left) and a bottom view (right) of a mirror ring with washers in the ion mirror of FIG. 3 according to the present teachings.

As described above, the ion mirror 1 according to the present teachings includes a plurality of mirror rings 201. In particular, the plurality of mirror rings 201 are disposed in series relative to one another such that their respective windows 2013 are substantially aligned to allow passage of the ions therethrough. By way of example, FIG. 9 shows two mirror rings that are separated from one another with a plurality of washers 301 interposed therebetween; and FIG. 10 shows a top view (left) and a bottom view (right) of the mirror rings with the washers. Although two mirror rings are shown in FIG. 9, more than two mirror rings can be stacked with similar configurations. The description below applies similarly for subsequent stacking of additional mirror rings. In the embodiment shown in FIG. 9, the mirror rings are stacked as 180 degrees rotated about the primary mirror axis of the ion mirror 1 so as to allow the second electrode 2017 of the upstream mirror ring 202 to make a contact with the electrical contact pad 2019 of the downstream mirror ring 203. In some such embodiments, a slot 2024 may be provided in the mirror rings to serve as a clearance hole for the electrical resistive element 2021 of the upstream mirror ring 202.

Herein, the terms "upstream" and "downstream" are used with reference to the propagation direction of incoming ions. For example, for any two adjacent mirror rings, the one that encounters an incoming ion beam first is considered to be positioned upstream of the other mirror ring of the pair (it is noted that the downstream ion ring encounters the reflected ion beam first).

To make electrical connection between adjacent mirror rings, the second electrode 2017 of an upstream mirror ring 202 of the pair is configured to make electrical contact with the electrical contact pad 2019 of a downstream mirror ring 203 such that a portion of a DC voltage applied to the first electrode 2015 of the upstream mirror ring 202 is conducted to the electrical contact pad 2019 of the downstream mirror ring 203.

Since the electrical resistive element 2021 is disposed between the first electrode 2015 and the second electrode 2017 of the lower mirror ring 202, the electrical resistive element 2021 forms a voltage divider between the first electrodes 2015 of the upstream mirror ring 202 and the downstream mirror ring 203.

Further, the upstream mirror ring 202 includes at least one electrically conductive spring 2023 to provide a compression contact between the upstream mirror ring 202 and the downstream mirror ring 203. In some embodiments, the spring 2023 is disposed on the second electrode 2017 such that it makes a compression contact with the electrical contact pad 2019 of the downstream mirror ring 203. More than one spring (e.g., a total of four in the example shown in FIG. 9) can be disposed on the upper surface of the upstream mirror ring 202 for providing compression contact between the upstream mirror ring 202 and the downstream mirror ring 203. Some of the springs may be disposed on non-conducting portions of the substrate 2011, and thereby mechanically pressing against the downstream mirror ring 203 without providing an electrical contact.

In this embodiment, the plurality of mirror rings 201 are in electrical contact with each other only via the electrically conductive spring 2023 and the electrical contact pad 2019. To maintain a predetermined space or gap between the frames 2011, one or more washers 301 can be disposed between adjacent mirror rings (e.g., between the upstream mirror ring 202 and the downstream mirror ring 203). As shown in FIG. 9, each of the washers 301 includes a fitting portion 3011 and a spacing portion 3013 such that the fitting portion of each washer can be received within a hole 2025 of each mirror ring. For example, the fitting portion 3011 of the washer 301 can be fitted into the corresponding hole 2025 formed in the downstream mirror ring 203. The washers 301 electrically insulate the upstream mirror ring 202 and the downstream mirror ring 203, while serving as a spacer between the two. Accordingly, the washers 301 are made of a material with electrical insulating properties, such as a ceramic material or polyether ether ketone (PEEK), among others.

In some embodiments, a thickness of the frame 2011 can be in a range of about 0.5 mm to about 4 mm, and a thickness of the spacing portion 3013 of the washers 301 can be in a range of about 0.5 mm to about 2 mm. A thickness (e.g., a protrusion distance) of the fitting portion 3011) can be smaller or greater than the thickness of the substrate 2011.

Figure 11:
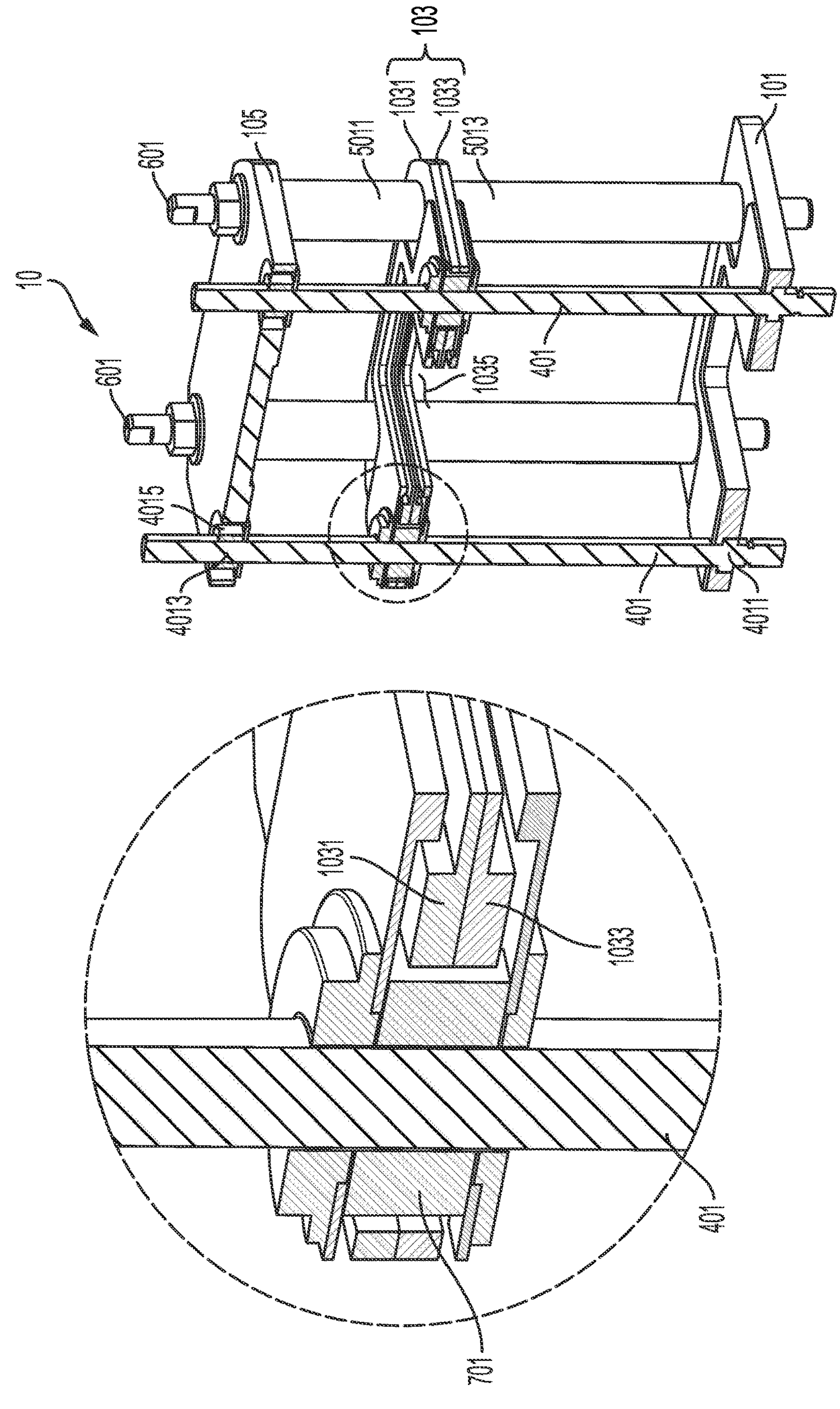
FIG. 11 shows a floating arrangement between the middle grid and fastening rods for the mirror rings in the ion mirror of FIG. 3 according to the present teachings.

Further, each of the washers 301 includes an inner hole 3015 at a center thereof, such that a rod 401 can be inserted through these central holes 3015 so as to help maintain and align the mirror rings 201 relative to one another, as discussed in more detail below. In particular, with reference to FIG. 5, a first set of rods 401 can be inserted through the inner holes 3015 of the washers 301. Subsequently, the first set of rods 401 align and mechanically join the plurality of mirror rings 201 relative to one another. The first set of rods 401 are inserted through the inner holes 3015 in the washers 301 disposed at the plurality of mirror rings 201. With reference to FIG. 11, each of the rods 401 includes a head portion 4011 and a threaded portion 4013. In some embodiments, a nut 4015 can be fastened to the threaded portion 4013 of the rod 401. In some embodiments, both ends of each of the first set of rods 401 can include threaded portions, such that the nuts can be tightened on both ends.

As shown in FIG. 6, each mirror ring 201 also includes at least one opening and/or cutout 2027 such that the openings 2027 of the plurality of mirror rings 201 are in substantial register when the mirror rings 201 are disposed in series relative to one another. Referring back to FIG. 3, the opening 2027 provides a clearance space for one or more posts 501 to be placed across the ion mirror 1 without engaging with the mirror rings 201.

Figure 12:
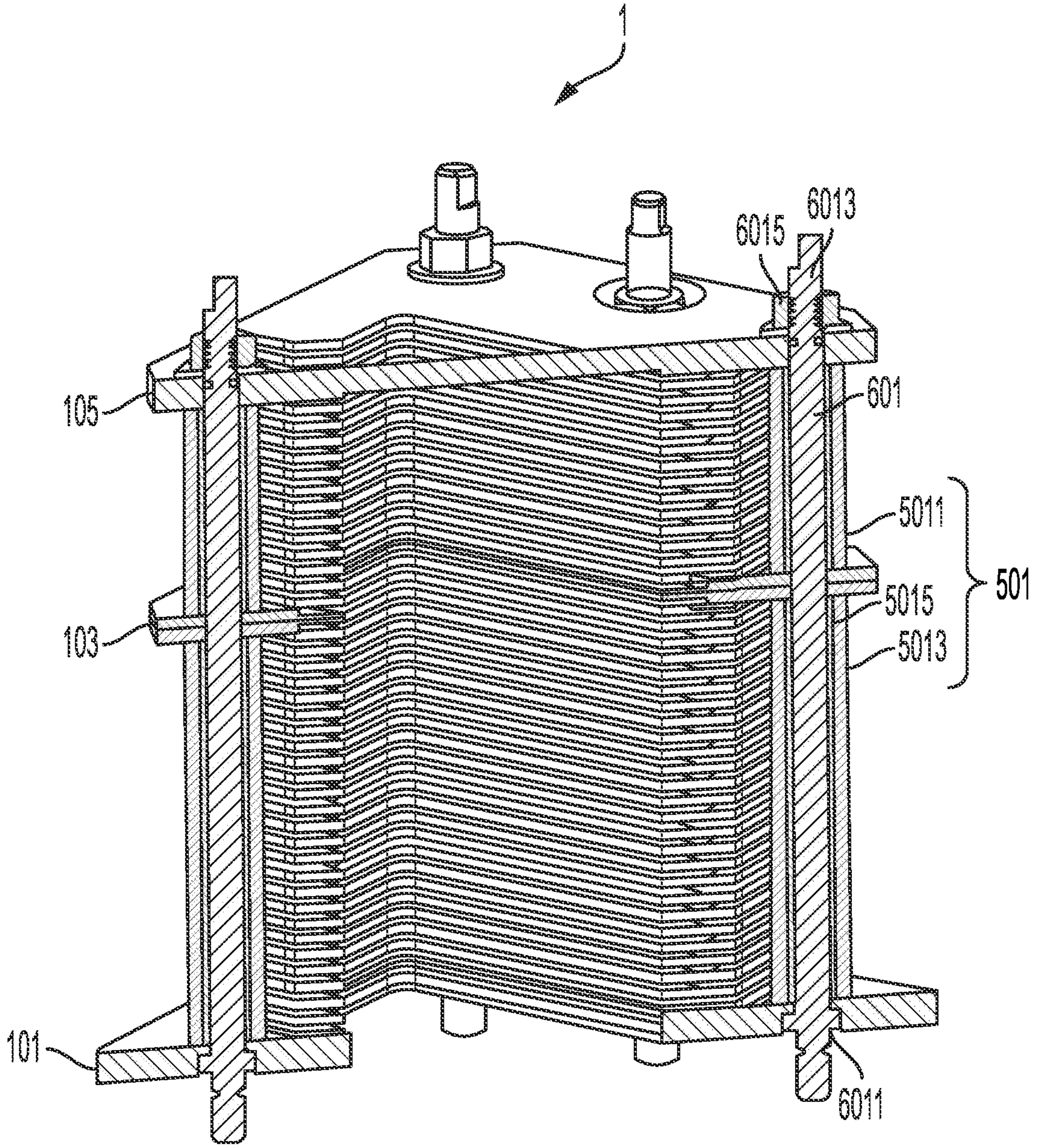
FIG. 12 shows a longitudinal cross-sectional view of the ion mirror of FIG. 3 according to the present teachings along the diagonal plane.

Each of the posts 501 includes an upper post 5011 and a lower post 5013 to allow the middle grid plate 103 to be held between the upper post 5011 and the lower post 5013. More specifically, as shown in FIG. 12, the middle grid plate 103 is disposed between a bottom end of the upper post 5011 and a top end of the lower post 5013. The mirror plate 105 is disposed at a top end of the upper post 5011, and the entrance grid plate 103 is disposed at a bottom end of the lower post 5013. Due to this configuration, the relative distances and parallelism between the grids can be controlled and maintained by the posts 501.

In order to maintain the entrance grid plate 101, the middle grid plate 103, and the mirror plate 105 to be electrically insulated from each other as well as from the plurality of mirror rings 201, and also to maintain precise positional relationships (e.g., distances, axial alignments, etc.) among the entrance grid plate 101, the middle grid plate 103, and the mirror plate 105, the posts 501 are made of an electrically insulating material that has a low thermal expansion coefficient, which can be machined to desired dimensions with high-precision. By way of example, the lengthwise tolerance of each post can be less than about 25 μm. In some embodiments, the posts 501 can be formed of any of ceramic, quartz, or borosilicate glass, among other suitable materials. Due to the low thermal expansion coefficient and the use of high-precision machining, the relative positions between the entrance grid plate 101, the middle grid plate 103, and the mirror plate 105 can be maintained more consistently regardless of the temperature changes in the structure.

Referring to FIG. 12, in this embodiment, the post 501 includes a hollow center 5015 that extends along a longitudinal extent thereof to allow a second set of rods 601 to be inserted through the hollow center 5015 of the post 501, thereby mechanically joining the mirror plate 105, upper post 5011, the middle grid plate 103, the lower post 5013, and the entrance grid plate 101 together. Each of the second set of rods 601 includes a head portion 6011 and a threaded portion 6013. A nut 6015 can be fastened at the threaded portion 6013. In some embodiments, both ends of each of the second set of rods 601 can include threaded portions, and the nuts can tightened on both ends.

In turn, the grid sub-assembly 10 and the mirror ring sub-assembly 20 can be coaxially superposed with each other such that the posts 501 of the grid sub-assembly 10 pass through the openings 2027 of the mirror rings 201. Accordingly, the mirror ring sub-assembly 20 and the grid sub-assembly 10 are both anchored to the entrance grid plate 101, but are otherwise independent.

Due to such independence of the two structures, in the grid sub-assembly 10, the positional relationships among the entrance grid plate 101, the middle grid plate 103, and the mirror plate 105 can be maintained and controlled with tight tolerances by the upper post 5011 and the lower post 5013, which are made of borosilicate glass in this embodiment, though other suitable materials can also be employed. The second set of rods 601 do not dictate the positional relationships among the entrance grid plate 101, the middle grid plate 103, and the mirror plate 105, and merely fasten them mechanically. In comparison, in the mirror ring sub-assembly 20 in which the positional relationships between the mirror rings 201 is less critical than in the grid sub-assembly 10, the first set of rods 401 align and join the mirror rings 201 through the washers 301. Moreover, the more relaxed tolerances of the mirror ring sub-assembly 20 cannot adversely affect the tolerances associated with the positional relationships among elements of the grid sub-assembly 10 because they share only the entrance grid plate 101 as their base, and do not confine each other.

Figure 13:
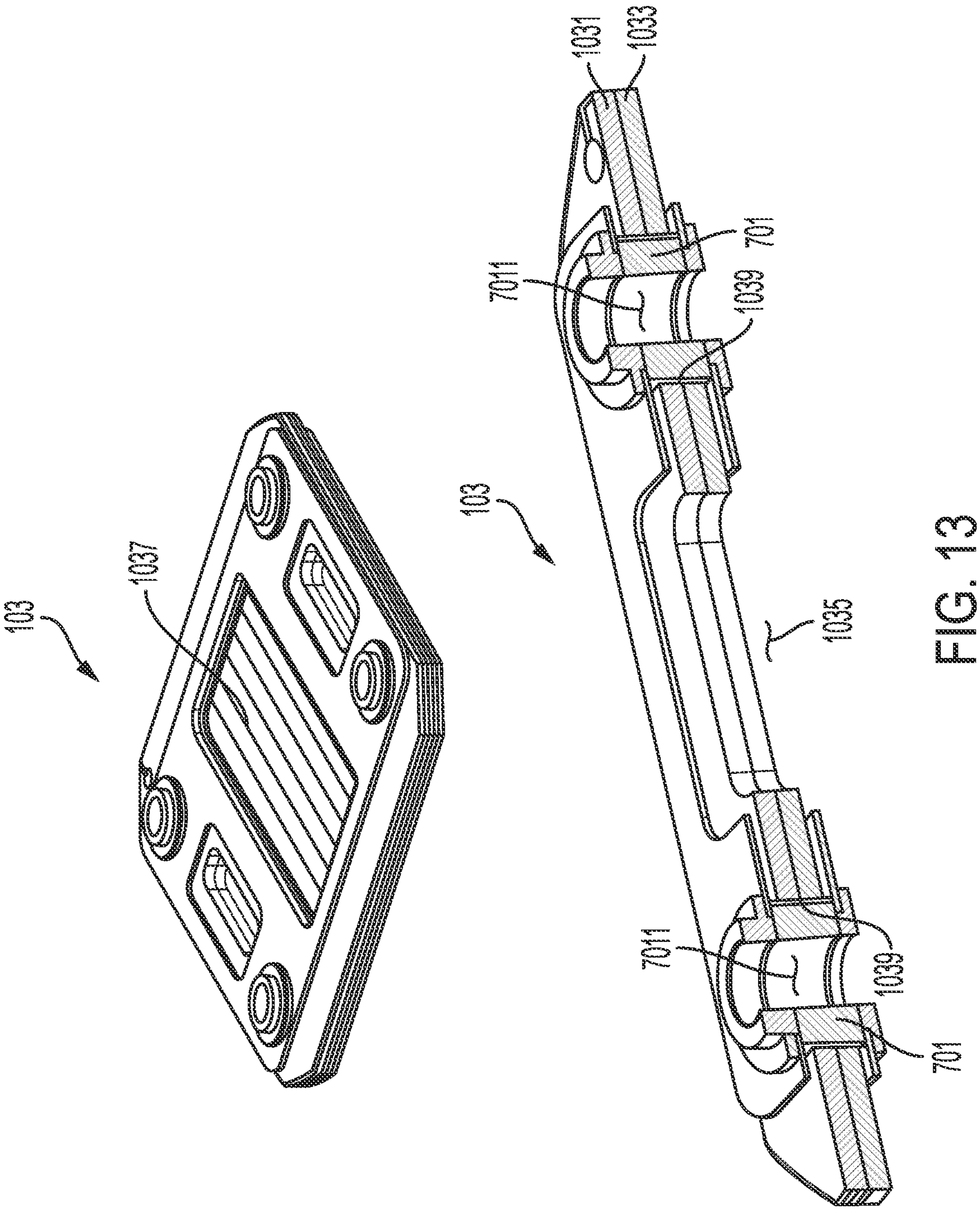
FIG. 13 shows a middle grid plate in the ion mirror of FIG. 3 according to the present teachings.

As described above, the grid disposed at the middle of the mirror rings 201 is maintained at ground potential and provides a boundary of the electric fields between the first stage and the second stage of the ion mirror 1. With reference to FIG. 13, the middle grid plate 103 includes a first plate 1031 and a second plate 1033, each having a window 1035, and a grid 1037 (herein also referred to as a mesh) that is interposed between the first plate 1031 and the second plate 1033 in the window 1035. To decouple the middle grid plate 103 from the mirror ring sub-assembly 20 (see also FIG. 11), a middle grid washer 701 is provided in the mirror ring sub-assembly 20. The middle grid plate 103 also includes a hole 1039, into which the middle grid washer 701 can be accommodated. Further, the washers 701 include an inner hole 7011 at a center thereof to allow the first set of rods 401 to be inserted therethrough. The hole 1039 provides a space for the first set of rods 401 of mirror ring sub-assembly 20 to pass through. In particular, since the middle grid washer 701 is accommodated in the hole 1039 without being engaged with the middle grid plate 103, they are mechanically decoupled, and the grid sub-assembly 10 can "mechanically float" with respect to the mirror ring sub-assembly 20. Further, the middle grid washer 701 contacts the washers 301 of the mirror ring sub-assembly 20 such that a compressive force can be exerted through the entire stack of the mirror rings 201.

Figure 14A:
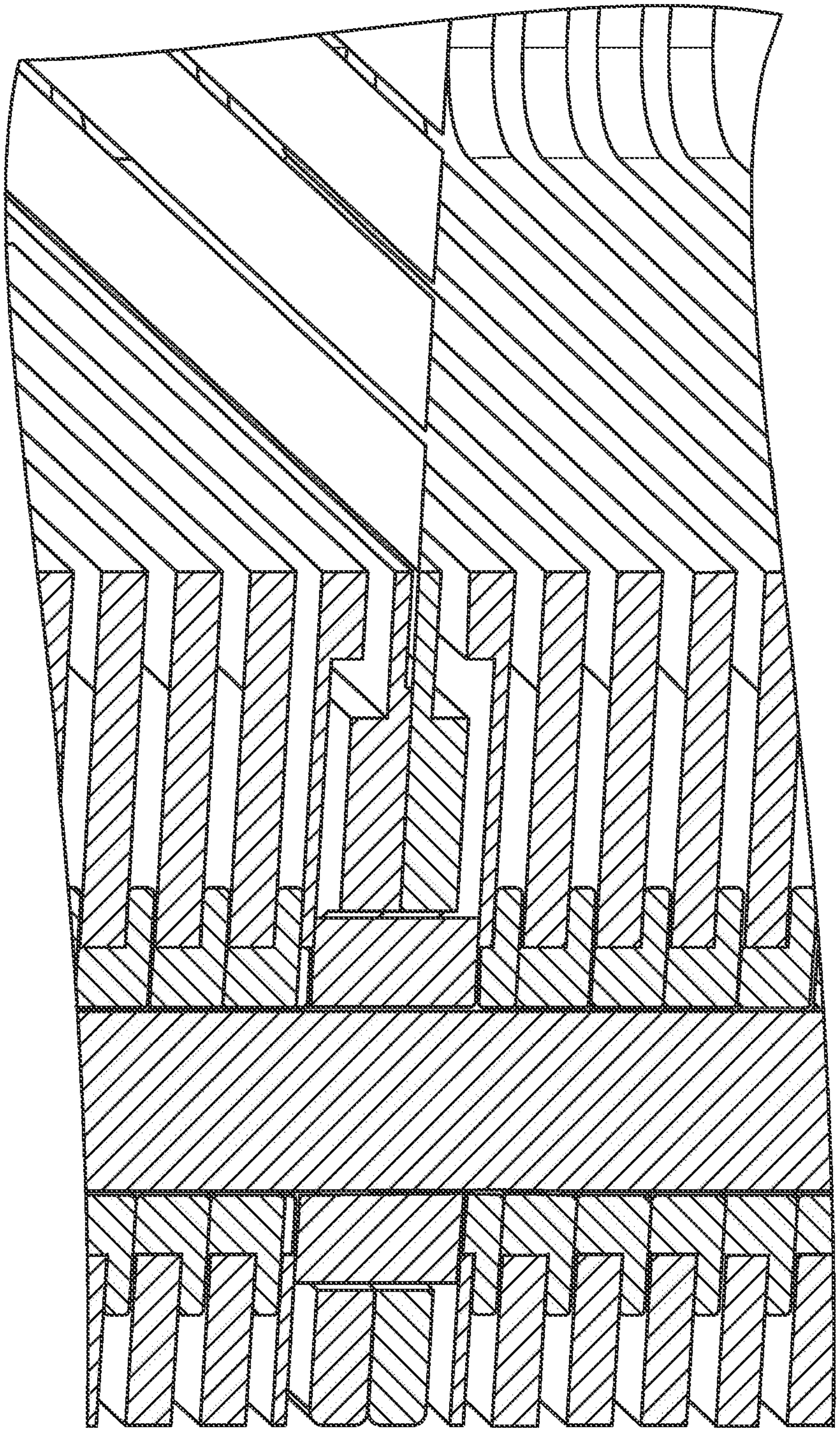
FIG. 14A shows an enlarged view for the configuration of the middle grid plate in relation with the mirror rings in the ion mirror of FIG. 3 according to the present teachings.
Figure 14B:
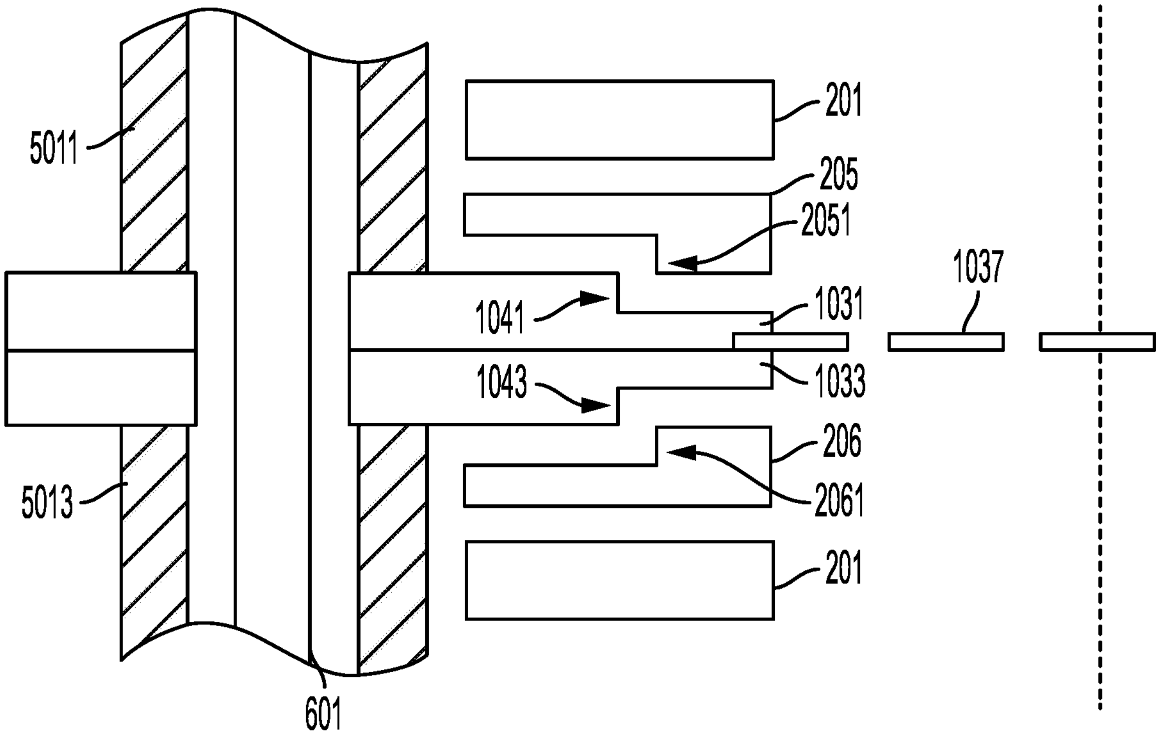
FIG. 14B schematically shows the relation of the middle grid plate and the mirror rings along with intermediate mirror rings along a cross-section through the post.
Figure 14C:
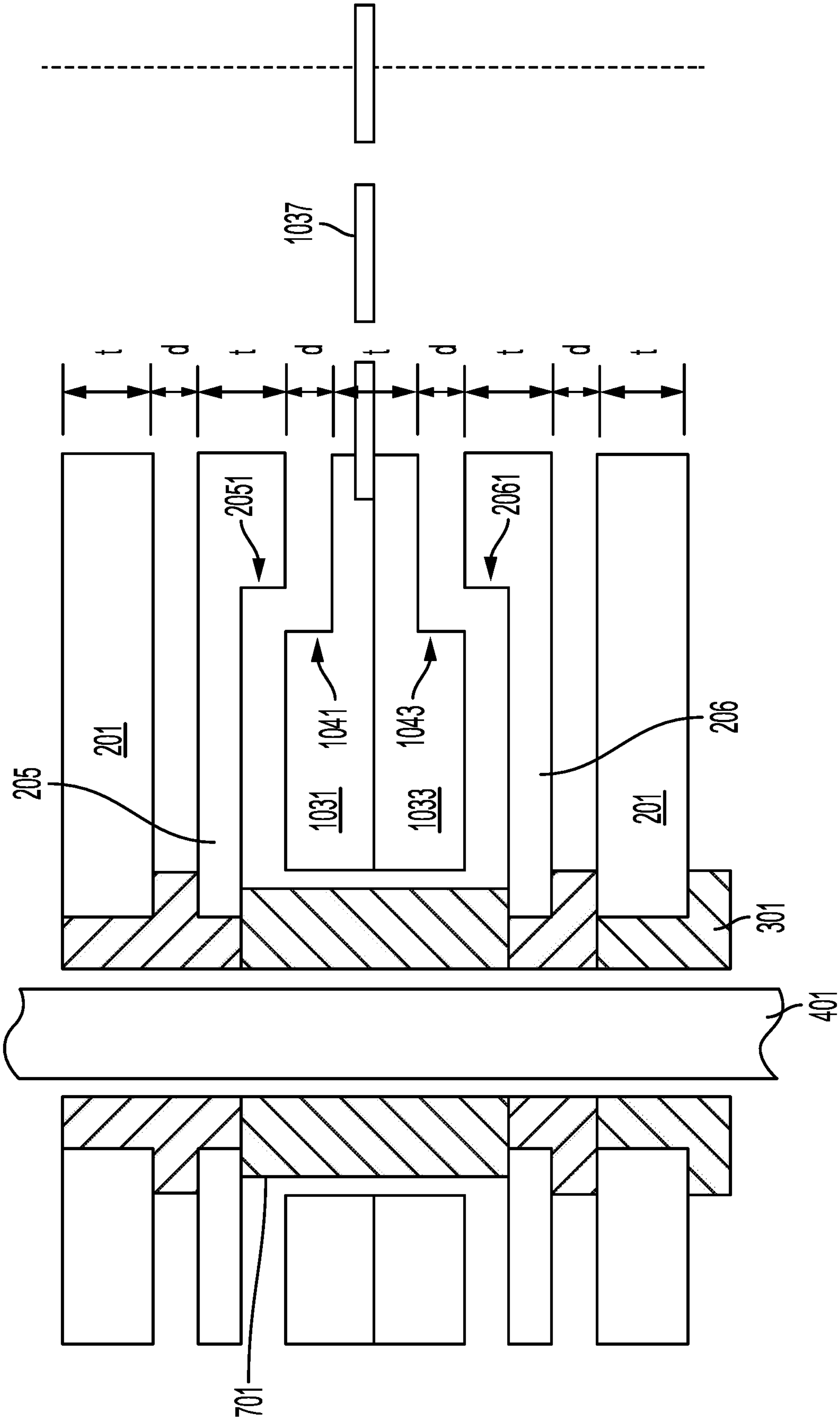
FIG. 14C schematically shows the relation of the middle grid plate and the mirror rings along with intermediate mirror rings along a cross-section through the spacers.

In order to form a more smoothly varying electric field, the mirror rings are required to be made as thin as possible and be disposed at equal intervals relative to one another. Reducing the thickness of the mirror rings, however, is often limited by the thickness of the middle grid because the fabrication of the mesh involves wrapping a coil around the middle grid plate, which process may induce warping of the middle grid plate if the middle grid plate is too thin. Further, the thickness t of each mirror ring 201 and the inner portion of the middle grid plate 103 are required to be substantially equal. In order to make the mirror rings and the middle grid plate uniformly thin and separated at equal intervals, the ion mirror 1 can further include a pair of intermediate mirror rings 205 and 206, between the middle grid plate 103 and other mirror rings 201, as shown in FIGS. 14A-14C. Each of the intermediate mirror rings 205 and 206 includes an inner portion and an outer periphery portion that are separated by a step 2051 and 2061, such that the inner portion of the intermediate mirror rings 205 and 206 protrude toward the middle grid plate 103. Due to the steps 2051 and 2061, the intermediate mirror rings 205 and 206 have relatively thinner outer periphery portion and relatively thicker inner portion. In some embodiments, the pair of intermediate mirror rings 205 and 206 can be made of a metal, such as copper.

Further, each of the first plate 1031 and the second plate 1033 of the middle grid plate 103 can also include a step 1041 and 1043, respectively, corresponding to the shape of the step 2051 and 2061 such that the inner portion (herein also referred to as a grid holding region) of the middle grid plate 103 can be maintained at the same thickness t as the mirror rings 201 while still ensuring a sufficient thickness in the portion that surrounds the inner portion. Accordingly, the separation distance d can be maintained substantially consistent between the grid holding region of the middle grid plate 103 and the inner portion of the intermediate mirror rings 205 and 206, and between the intermediate mirror rings 205 and 206 and the mirror rings 201. As a result, the ion mirror 1 can create a smoother electric field while maintaining a compact form factor.

In other words, the intermediate mirror rings 205 and 206 have relatively thinner outer periphery portion so as to provide a space or clearance that allows the outer periphery portion of the middle grid plate 103 to be made thicker than its inner portion. Due to the stepped configuration, both the middle grid plate 103 and the mirror rings 201 can be made sufficiently thin without sacrificing the rigidity of the middle grid plate 103. By way of example, the uniform thickness t can be between about 1 mm and about 2 mm (e.g., 1.526 mm) while the thicker outer periphery portion of the middle grid plate 103 can be about 4 mm (i.e., about 2 mm thick first plate 1031 and about 2 mm thick second plate 1033).

Figure 16:
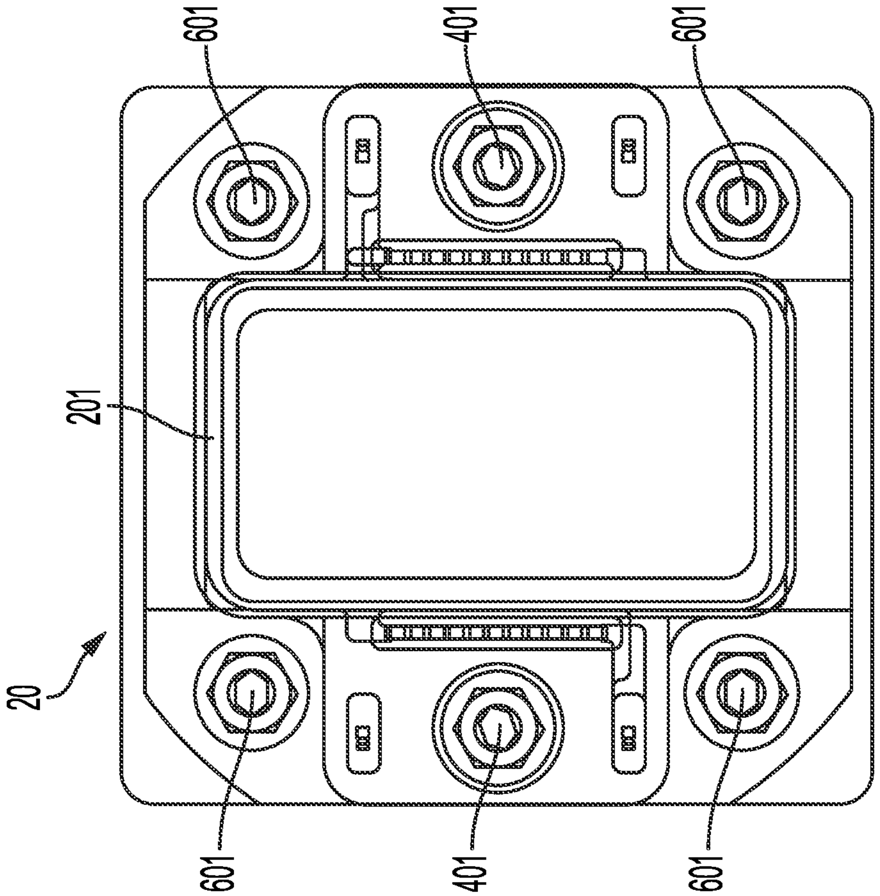
FIG. 16 shows a top view of the ion mirror of FIG. 3 according to the present teachings, with the mirror plate removed and the mirror rings shown in transparency for illustration purposes.
Figure 15:
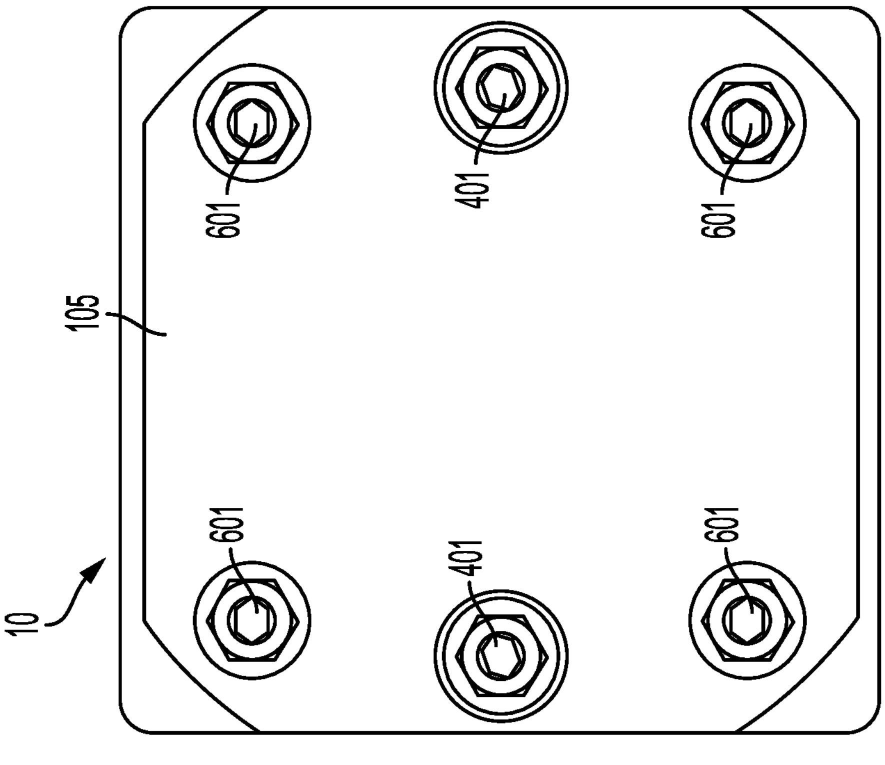
FIG. 15 shows a top view of the ion mirror of FIG. 3 according to the present teachings.
Figure 17:
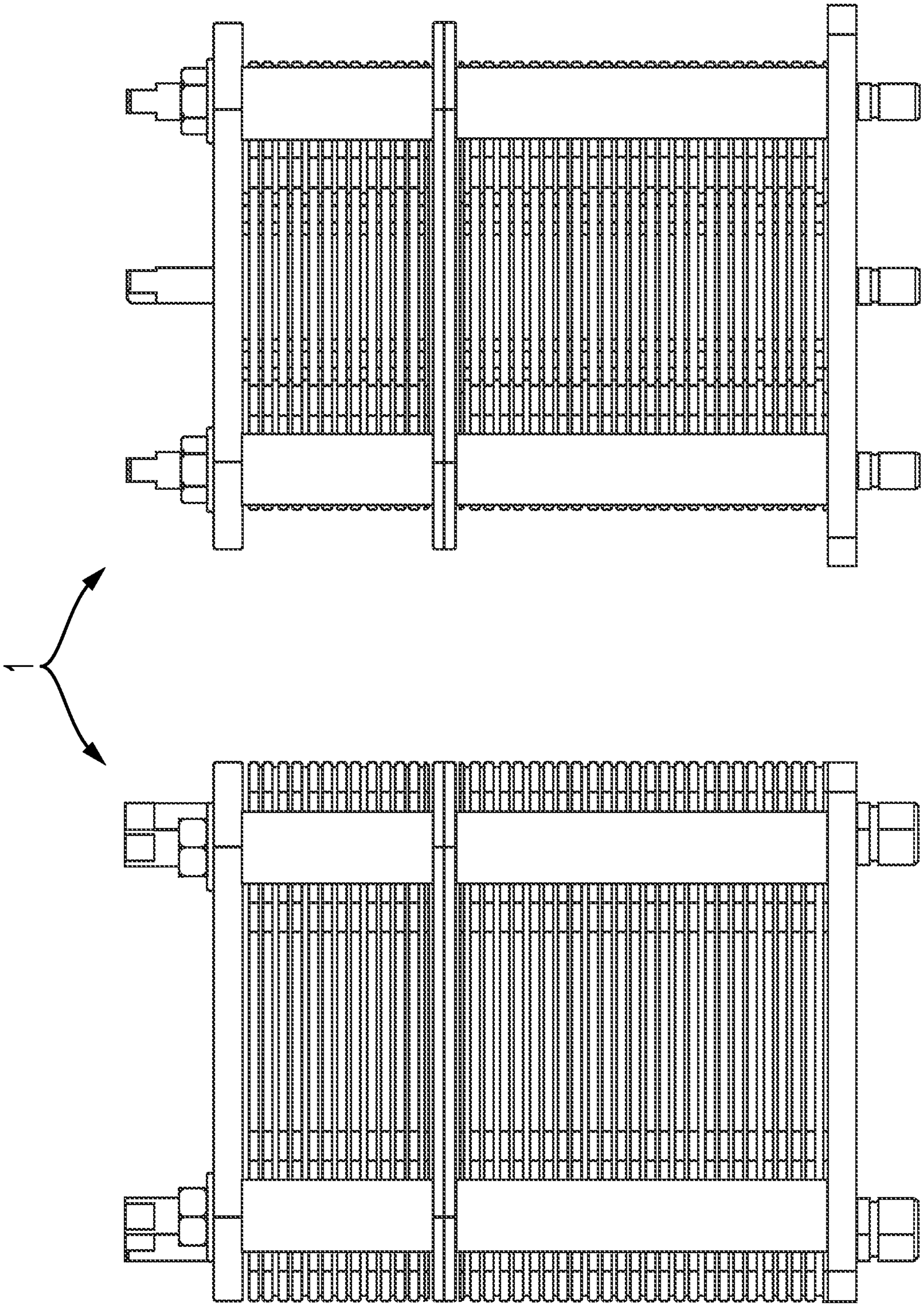
FIG. 17 shows side views of the ion mirror of FIG. 3 according to the present teachings.
Figure 19:
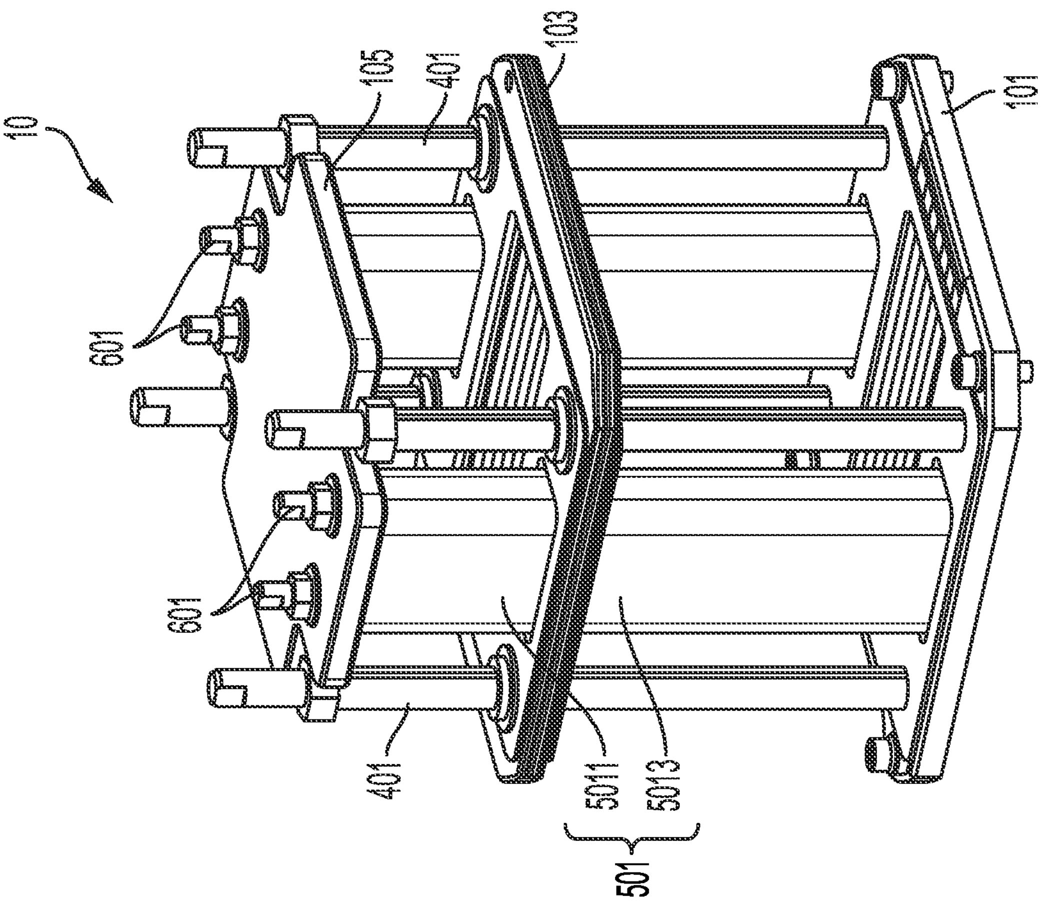
FIG. 19 shows a sub-assembly to hold and position the grids in the ion mirror of FIG. 18 according to the present teachings.
Figure 18:
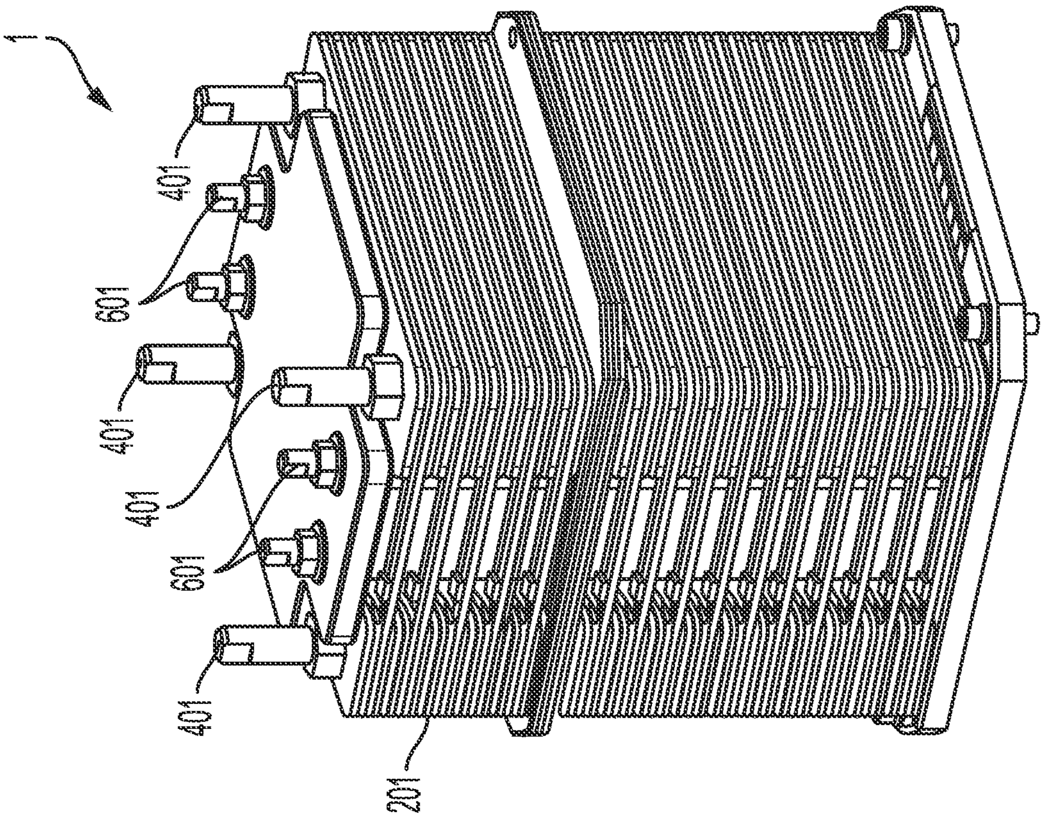
FIG. 18 shows another embodiment of an ion mirror according to the present teachings.
Figure 21:
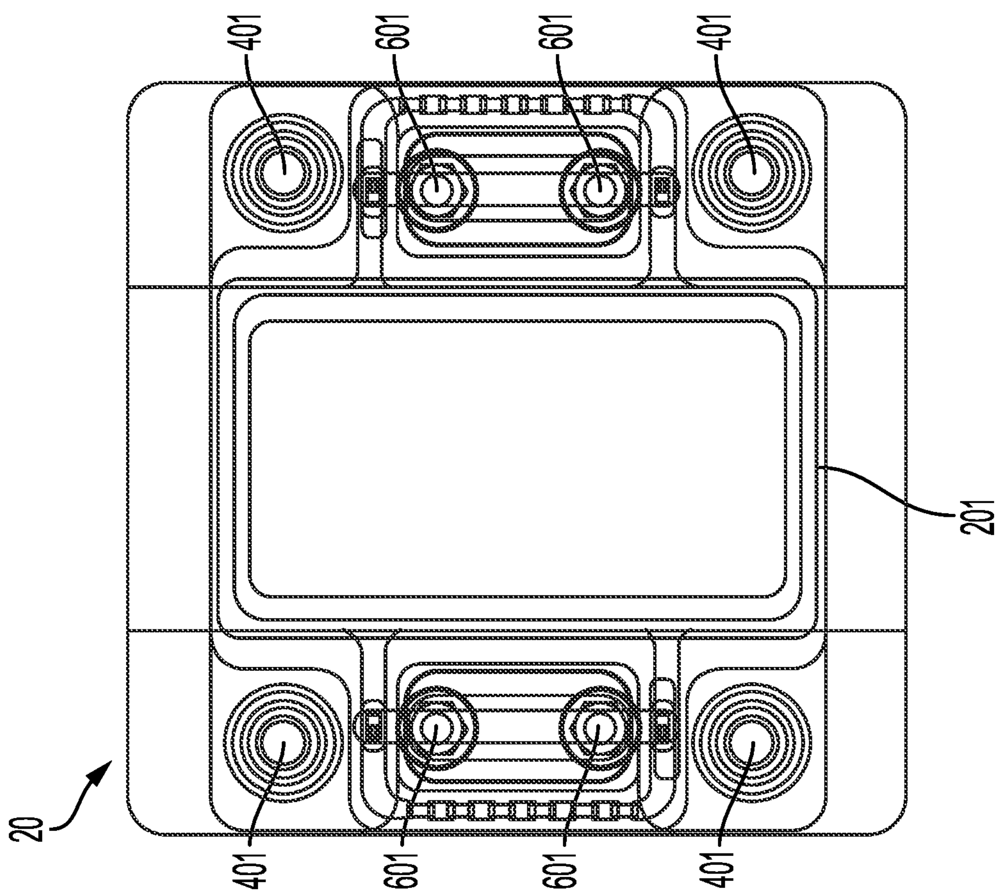
FIG. 21 shows a top view of the ion mirror of FIG. 18 according to the present teachings, with the mirror plate removed and the mirror rings shown in transparency for illustration purposes.
Figure 20:
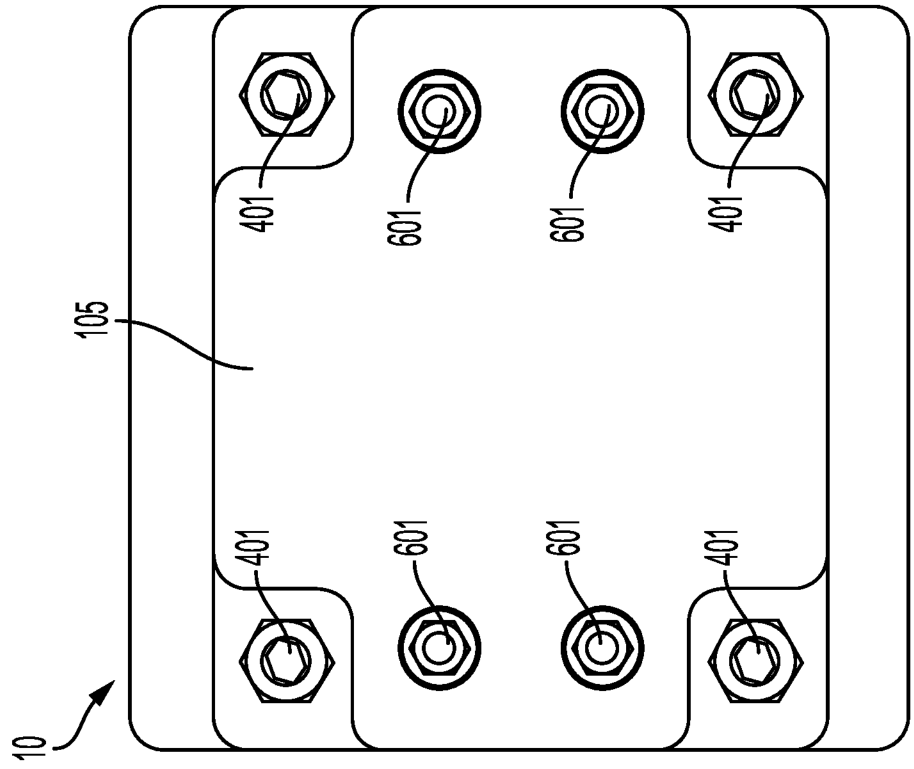
FIG. 20 shows a top view of the ion mirror of FIG. 18 according to the present teachings.

FIG. 15 shows a top view of the ion mirror 1, and FIG. 16 shows a top view of the ion mirror 1, with the mirror plate 105 removed and the mirror rings 201 shown in transparency for illustration purposes. FIG. 17 shows side views of the ion mirror 1. Referring to FIGS. 4, 11, 12, and 17, it can be seen that the mirror plate 105 is placed at the top of the upper post 5011, and the entrance grid plate 101 is placed at the bottom of the lower post 5013. The middle grid plate 103 is interposed between the upper post 5011 and the lower post 5013, and subsequently, the second set of rods 601 mechanically join the grid sub-assembly 10. Further, as shown in FIGS. 12 and 17, the mirror rings 201 are disposed between the entrance grid plate 101 and the middle grid plate 103, and between the middle grid plate 103 and the mirror plate 105 while being aligned and mechanically joined to one another by the first set of rods 401 and the washers 301. As such, while the two sub-assemblies share the entrance grid plate 101 as their bases and are anchored thereto, the grid plates and the mirror rings 201 are aligned and tightened by separate sets of rods, and the tolerance of one sub-assembly does not affect the tolerance of the other, allowing the grid sub-assembly 10 to be made with a tighter tolerance than the mirror ring sub-assembly 20.

In use, ions are received through the entrance grid plate 101, decelerated while propagating toward the mirror plate 105, reversed, and then accelerated in the reverse direction. As noted above, a voltage gradient applied to the plurality of mirror rings 201 can create an axial electric field, and the grids or mesh included in the entrance grid plate 101 and the middle grid plate 103 can improve the radial homogeneity of the electric field by confining the electric fields at the grid planes.

With reference to FIGS. 18-24, a second embodiment of an ion mirror according to the present teachings is similar to the embodiment described above, except that in this embodiment, two posts 501 (i.e., two sets of upper posts 5011 and lower posts 5013) are employed for maintaining and aligning the mirror rings relative to one another, as opposed to four posts in the previous embodiment. Also, the first set of rods have four rods as opposed to two rods in the previous embodiment. The number of washers for the mirror rings and for the middle grid plate are correspondingly determined as well.

Figure 22:
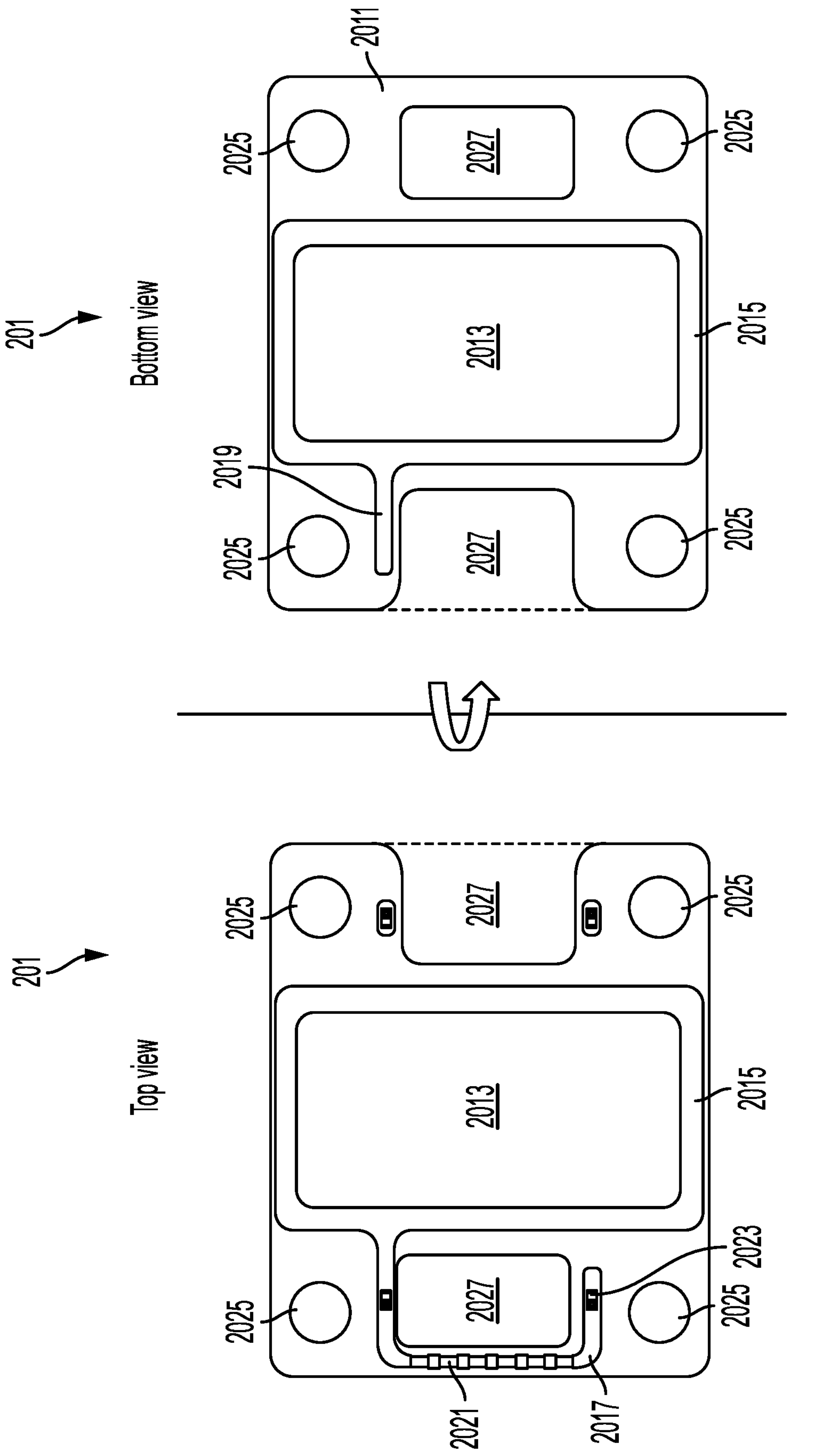
FIG. 22 shows a top view (left) and a bottom view (right) of a mirror ring in the ion mirror of FIG. 18 according to the present teachings.
Figure 24:
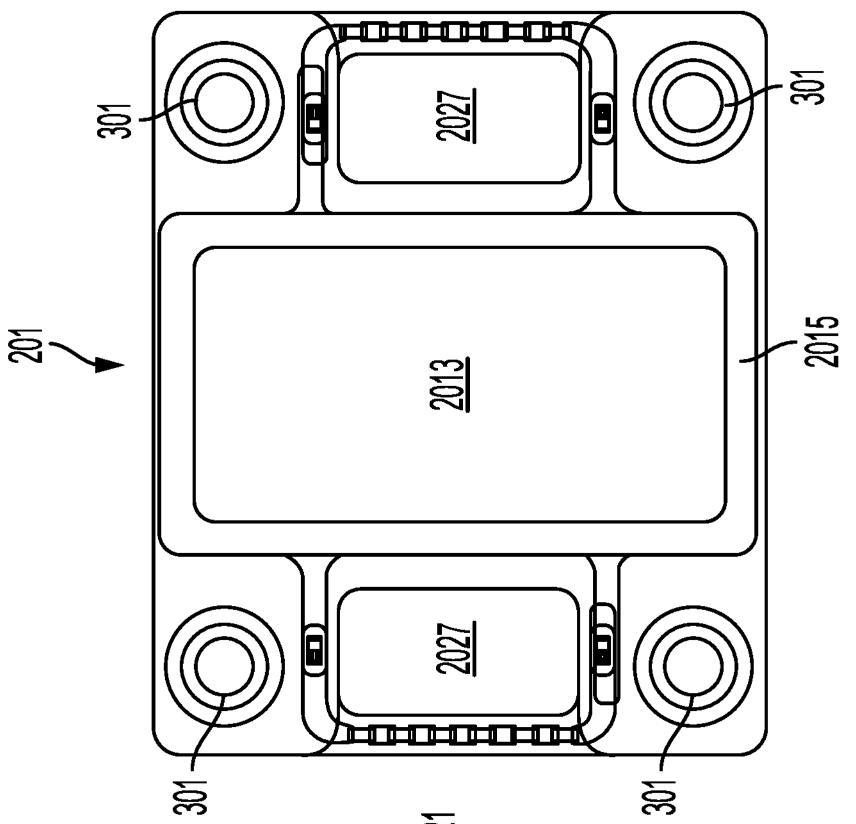
FIG. 24 shows a bottom view of a pair of mirror rings with washers in the ion mirror of FIG. 18 according to the present teachings, shown in transparency for illustration purposes.
Figure 23:
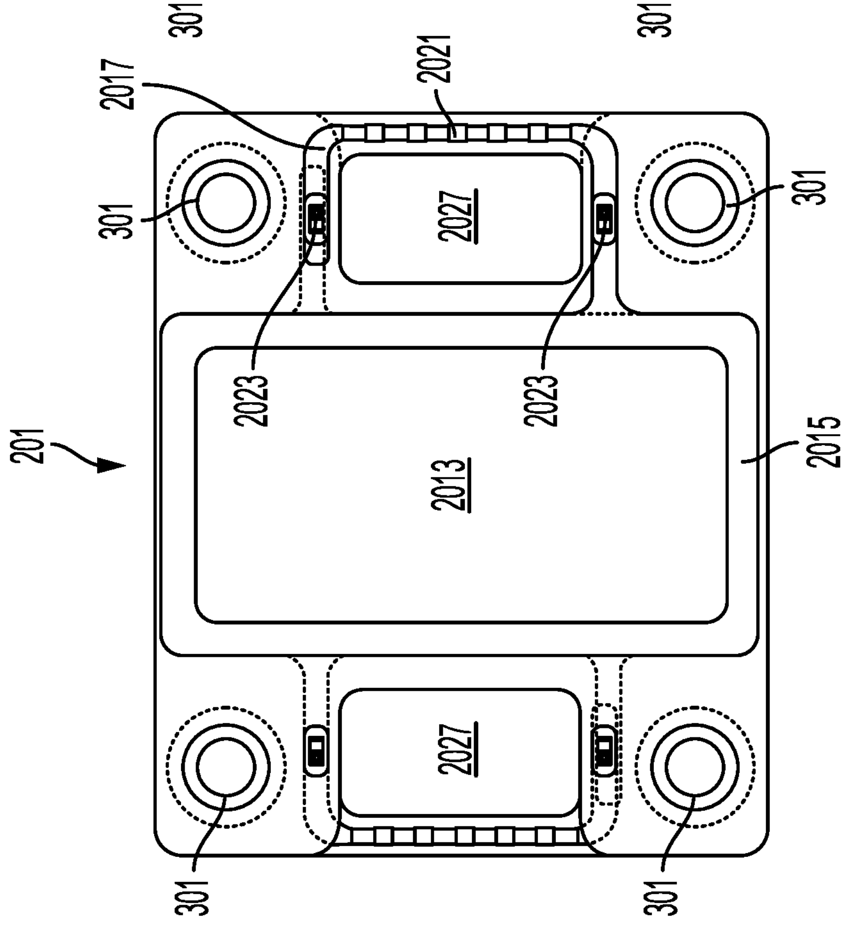
FIG. 23 shows a top view of a pair of mirror rings with washers in the ion mirror of FIG. 18 according to the present teachings.

In addition, referring to FIG. 22, the shape of the opening and/or cutout 2027 is different in the second embodiment. Whereas the opening and/or cutout 2027 is formed as a cutout at four corners of the mirror ring 201 in the first embodiment, the mirror ring 201 in the second embodiment includes one (left one shown in the top view) of the opening and/or cutout 2027 formed as an opening and another (right one shown in the top view) formed as a cutout. The configuration (e.g., number and shape) of the opening and/or cutout 2027 is not limited to the examples shown in the first and second embodiments, and it can be variously changed based on the present teachings.

An ion mirror according to the present teachings can be incorporated in a variety of TOF mass analyzers, and such TOF mass analyzer can be incorporated into a variety of mass spectrometers, include quadrupole-ToF mass spectrometers. Referring back to FIG. 1, the TOF mass analyzer includes an inlet 5 for receiving a plurality of ions, a pusher electrode 6 for directing at least a portion of the ions into a field-free drift path, an ion reflector (e.g., ion mirror 1) for receiving at least a portion of the ions propagating through the field-free drift path and reflecting the ions onto a second field-free drift path, and a detector 7 disposed at a distal end of the second field-free drift path for receiving at least a portion of the reflected ions and generating one or more detection signals in response to detection of the ions. In particular, the ion reflector can be implemented as an ion mirror according to the present teachings as described herein.

Further, a time-of-flight mass spectrometer (TOF-MS) according to the present teachings includes the TOF mass analyzer described above, and further includes a mass filter disposed upstream of the TOF mass analyzer for selecting at least a portion of the ions, and one or more transfer ion optics disposed upstream of the mass filter for transmission of the ions from an ion source to the mass filter.

Those having ordinary skill in the art will appreciate that various changes can be made to the above embodiments without departing from the scope of the present teachings.

The invention claimed is:

1. An ion mirror for creating an electric field to decelerate incoming ions and accelerate outgoing ions, comprising:
- a grid sub-assembly, comprising:
  - a first plate unit that supports an entrance/exit grid for defining a boundary of a first electric field;
  - a second plate unit for defining a boundary of a second electric field; and
  - a third plate unit that supports a middle grid for defining a boundary between the first electric field and the second electric field; and
- a mirror ring sub-assembly, comprising:
  - a first stack of mirror rings disposed between the first plate unit and the third plate unit, the first stack of mirror rings creating the first electric field; and
  - a second stack of mirror rings disposed between the second plate unit and the third plate unit, the second stack of mirror rings creating the second electric field,
- wherein the mirror ring sub-assembly and the grid sub-assembly are coaxially positioned relative to one another, and
- wherein the mirror ring sub-assembly and the grid sub-assembly float relative to one another by being mechanically engaged only at one of the first plate unit, the second plate unit, or the third plate unit.

2. The ion mirror of claim 1, wherein the mirror ring sub-assembly is anchored to the first plate unit of the grid sub-assembly, or
- wherein the second plate unit is configured as a solid plate or configured to support an end grid.

3. The ion mirror of claim 1, wherein the grid sub-assembly further comprises one or more posts disposed between the first plate unit and the third plate unit, and between the second plate unit and the third plate unit, and
- wherein relative positions between the first plate unit, the second plate unit, and the third plate unit are maintained by the one or more posts, and wherein optionally the one or more posts comprise a non-conducting material.

4. The ion mirror of claim 1, wherein the first and second stacks of mirror rings comprise a metallic conducting material or a PCB material with a conductive metal layer deposited at least on a portion thereof for applying the sequentially divided voltages.

5. An ion mirror for use in a time-of-flight mass spectrometer, comprising:
- a plurality of mirror rings each comprising:
  - a frame that is electrically non-conducing, having a window configured to allow passage of ions therethrough;
  - a first electrode disposed around at least a portion of a circumference of the window and being configured for application of a DC voltage thereto for generating a field within the window for affecting trajectory of ions passing through the window;
  - a second electrode disposed on a top surface of the frame and in electrical contact with the first electrode;
  - an electrical contact pad disposed on a bottom surface of the frame and in electrical contact with the first electrode; and
  - at least one electrical resistive element disposed between the first and second electrode, wherein, for a pair of adjacent mirror rings among the plurality of mirror rings. the second electrode of a lower mirror ring of the pair of adjacent mirror rings comprises at least one electrically conductive spring configured to provide a compression contact with the electrical contact pad of an adjacent upper mirror ring of the pair of adjacent mirror rings.

6. The ion mirror of claim 5, wherein the frame comprises a printed circuit board (PCB), and wherein optionally said PCB is made of Rogers material, and wherein, optionally, the at least one electrical resistive element is integrated in the PCB.

7. The ion mirror of claim 5, wherein the plurality of mirror rings are disposed in series relative to one another such that their respective windows are substantially aligned to allow passage of ions therethrough, and wherein, optionally, for the pair of adjacent mirror rings, the at least one electrically conductive spring is configured to make electrical contact with the electrical contact pad of the adjacent upper mirror ring such that a portion of a DC voltage applied to the first electrode of the lower mirror ring is applied to the electrical contact pad of the adjacent upper mirror ring.

8. The ion mirror claim 7, wherein the electrical resistive element forms a voltage divider between the first electrodes of the pair of adjacent mirror rings.

9. The ion mirror of claim 7, wherein each of the mirror rings comprises a plurality of holes for aligning the plurality of mirror rings.

10. The ion mirror of claim 9, further comprising a plurality of spacers disposed corresponding to each of the plurality of holes.

11. The ion mirror of claim 10, wherein the spacers are substantially formed as washers exhibiting electrically insulating property, wherein the washers optionally comprise ceramic or PEEK.

12. The ion mirror of claim 5, wherein the frame has a thickness in a range of about 0.5 mm to about 4 mm, and wherein, optionally, the spacers have a thickness in a range of about 0.5 mm to about 2 mm.

13. The ion mirror of claim 10, wherein each of the spacers includes an inner hole at a center thereof.

14. The ion mirror of claim 13, further comprising a first set of rods configured to align and mechanically join the plurality of mirror rings while passing through the inner hole in the spacers disposed at the plurality of mirror rings.

15. The ion mirror of claim 5, wherein any of the first electrode, the second electrode, and the electrical contact pad of each of the plurality of mirror rings comprises at least one metal layer, and wherein, optionally, the at least one metal layer has a thickness in a range of about 35 μm to about 70 μm.

16. The ion mirror of claim 7, further comprising:

an entrance grid plate disposed at an upstream end of the ion mirror;

a middle grid plate disposed between the plurality of mirror rings;

a mirror plate disposed at a downstream end of the ion mirror, and optionally, wherein at least one post is disposed between the entrance grid plate and the middle grid plate, and between the middle grid plate and the mirror plate, wherein the at least one post maintains relative distances between the entrance grid plate, the middle grid plate, and the mirror plate, and wherein the at least one post comprises a non-conducting material.

17. The ion mirror of claim 14, wherein each of the plurality of mirror rings comprises at least one opening such that the at least one opening of each of the plurality of mirror rings is aligned with a corresponding opening among the at least one opening of others of the plurality of mirror rings when the mirror rings are disposed in series relative to one another, and wherein the at least one opening allows the at least one post to be inserted through the plurality of mirror rings without engaging with the plurality of mirror rings.

18. The ion mirror of claim 16, further comprising a second set of rods, wherein the at least one post comprises a hollow channel that extends along a longitudinal direction thereof, and wherein the second set of rods are inserted through the hollow channel in the at least one post, thereby fastening a portion of the at least one post above the middle grid plate, the middle grid plate, and a portion of the at least one post below the middle grid plate.

19. The ion mirror of claim 16, wherein the middle grid plate comprises:

two plates, each having a window;

a grid interposed between the two plates in the window, wherein the ion mirror optionally further comprises one or more middle grid washers that include an inner hole at a center thereof, wherein the middle grid plate comprises at least one hole, and wherein the middle grid washers are accommodated in the at least one hole formed in the middle grid plate, and the first set of rods are inserted through the inner hole of the middle grid washers.

* * * * *